United States Patent
Siessegger et al.

(10) Patent No.: US 9,246,403 B2
(45) Date of Patent: Jan. 26, 2016

(54) LIGHTING SYSTEMS WITH UNIFORM LED BRIGHTNESS

(71) Applicants: Bernhard Siessegger, Danvers, MA (US); Marijan Kostrun, Newbury, MA (US)

(72) Inventors: Bernhard Siessegger, Danvers, MA (US); Marijan Kostrun, Newbury, MA (US)

(73) Assignee: OSRAM SYLVANIA INC., Wilmington, MA (US)

( * ) Notice: Subject to any disclaimer, the term of this patent is extended or adjusted under 35 U.S.C. 154(b) by 0 days.

(21) Appl. No.: 14/372,941

(22) PCT Filed: Jan. 22, 2013

(86) PCT No.: PCT/US2013/022488
§ 371 (c)(1),
(2) Date: Jul. 17, 2014

(87) PCT Pub. No.: WO2013/110052
PCT Pub. Date: Jul. 25, 2013

(65) Prior Publication Data
US 2014/0361696 A1    Dec. 11, 2014

Related U.S. Application Data

(60) Provisional application No. 61/588,838, filed on Jan. 20, 2012.

(51) Int. Cl.
*H02M 7/06*    (2006.01)
*H05B 33/08*   (2006.01)
(Continued)

(52) U.S. Cl.
CPC .............. *H02M 7/06* (2013.01); *H01L 25/167* (2013.01); *H01L 27/156* (2013.01); *H01L 33/62* (2013.01);
(Continued)

(58) Field of Classification Search
CPC ........... H05B 33/0827; H05B 33/0845; H05B 33/0812
USPC ................................................... 315/186, 193
See application file for complete search history.

(56) References Cited

U.S. PATENT DOCUMENTS 6,072,280 A * 6/2000 Allen .......................... 315/185 S
2004/0090403 A1  5/2004 Huang
(Continued)

FOREIGN PATENT DOCUMENTS

WO    WO2007/023454 A1    3/2007

OTHER PUBLICATIONS

PCT Search Report, Apr. 6, 2013.

*Primary Examiner* — Dylan White
(74) *Attorney, Agent, or Firm* — Andrew Martin

(57) ABSTRACT

Solid state lighting systems are disclosed for providing uniform brightness of LEDs serially connected in a string. In some embodiments, the LEDs can be powered directly from the mains such that no switch-mode power supply or the output storage elements associated therewith are needed. In some such cases, a linear regulator and switches can be used to control the current through the LEDs to provide uniform brightness. Other embodiments can be used with a switch-mode based driver topology and/or storage elements coupled in parallel with clusters of the LEDs. In any such cases, control logic (e.g., microcontroller or other suitable controller) can be used to control the switches accordingly to provide uniform brightness, and in some cases, to mitigate the implications of having no SMPS output storage element. In some embodiments, the switching pattern provided by the control logic is random, although other switching patterns can be used.

19 Claims, 18 Drawing Sheets

(51) Int. Cl.
*H01L 25/10* (2006.01)
*H01L 25/16* (2006.01)
*H05B 37/02* (2006.01)
*H05B 41/39* (2006.01)
*H01L 27/15* (2006.01)
*H01L 33/62* (2010.01)
*H01L 25/075* (2006.01)
*G01R 31/26* (2014.01)
*G01R 31/40* (2014.01)
*G01R 31/44* (2006.01)
*G01R 31/02* (2006.01)

(52) U.S. Cl.
CPC .......... *H05B 33/0803* (2013.01); *H05B 33/083* (2013.01); *H05B 33/086* (2013.01); *H05B 33/0806* (2013.01); *H05B 33/0812* (2013.01); *H05B 33/0815* (2013.01); *H05B 33/0821* (2013.01); *H05B 33/0827* (2013.01); *H05B 33/0845* (2013.01); *H05B 33/0848* (2013.01); *H05B 33/0851* (2013.01); *H05B 33/0884* (2013.01); *H05B 33/0893* (2013.01); *H05B 37/0209* (2013.01); *H05B 41/39* (2013.01); *G01R 31/028* (2013.01); *G01R 31/2633* (2013.01); *G01R 31/2635* (2013.01); *G01R 31/40* (2013.01); *G01R 31/44* (2013.01); *H01L 25/0753* (2013.01); *H01L 2224/48091* (2013.01); *H01L 2224/48227* (2013.01); *H01L 2224/48247* (2013.01); *H01L 2924/12032* (2013.01); *H01L 2924/12044* (2013.01); *H01L 2924/1301* (2013.01); *H01L 2924/1305* (2013.01); *H01L 2924/13033* (2013.01); *H01L 2924/13091* (2013.01); *Y02B 20/343* (2013.01); *Y02B 20/345* (2013.01); *Y02B 20/346* (2013.01); *Y02B 20/347* (2013.01); *Y10T 307/615* (2015.04)

(56) References Cited

U.S. PATENT DOCUMENTS

| | | | |
|---|---|---|---|
| 2006/0038803 A1* | 2/2006 | Miller et al. | 345/204 |
| 2007/0257623 A1* | 11/2007 | Johnson et al. | 315/193 |
| 2009/0230883 A1 | 9/2009 | Haug | |
| 2011/0068701 A1* | 3/2011 | van De Ven et al. | 315/185 R |
| 2011/0163680 A1* | 7/2011 | Welten | 315/186 |
| 2011/0227490 A1* | 9/2011 | Huynh | 315/185 R |
| 2011/0309759 A1* | 12/2011 | Shteynberg et al. | 315/201 |
| 2012/0104974 A1* | 5/2012 | Saes et al. | 315/297 |
| 2012/0229030 A1* | 9/2012 | Moskowitz et al. | 315/122 |
| 2014/0118417 A1* | 5/2014 | Kang et al. | 345/690 |
| 2014/0210351 A1* | 7/2014 | Yu et al. | 315/122 |
| 2014/0252967 A1* | 9/2014 | van de Ven et al. | 315/188 |
| 2014/0361696 A1* | 12/2014 | Siessegger et al. | 315/186 |

* cited by examiner

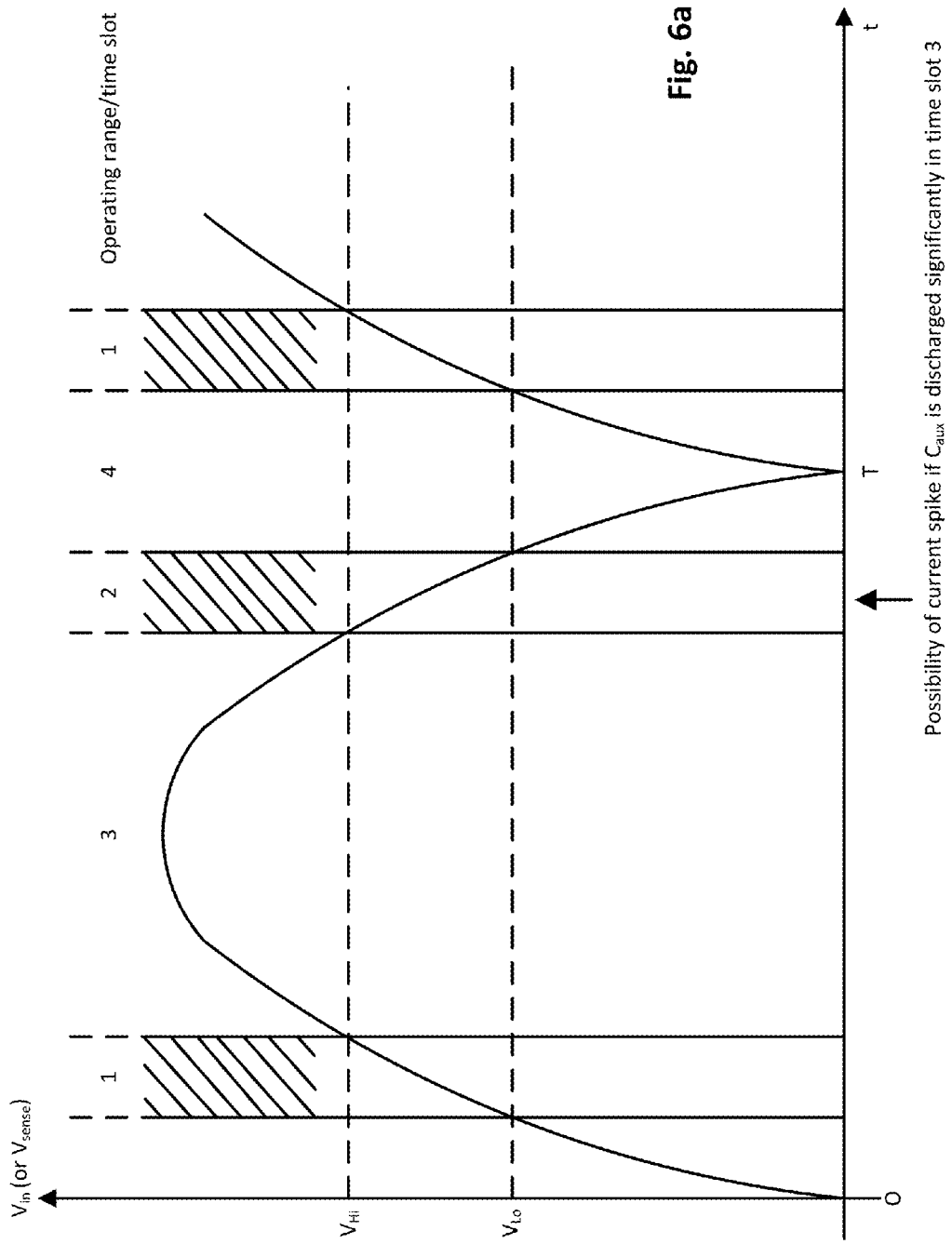

Main Program – Variant 2:

Main Program – Variant 3:

LIGHTING SYSTEMS WITH UNIFORM LED BRIGHTNESS

RELATED APPLICATIONS

This application is a U.S. National Stage application of, and claims the benefit of, International Application PCT PCT/US2013/022488, filed Jan. 22, 2013, which claims the benefit of Provisional Application No. 61/588,838, filed Jan. 20, 2012. In addition, this application is related U.S. application Ser. No. 13/229,611, filed Sep. 9, 2011. Each of these applications is herein incorporated by reference in its entirety.

FIELD OF THE DISCLOSURE

The present application relates to lighting systems, and more specifically to light emitting diode (LED) lighting systems configured to provide uniform LED brightness.

BACKGROUND

Light emitting diodes (LEDs) and driving circuits can be electrically connected to provide a given lighting system. A typical driving circuit is configured with a switch-mode power supply topology, and includes a filtering capacitor in parallel to the LED string being powered. Depending on the input power source, a bridge rectifier may also be included in the topology. Optionally, a linear resistance controller in series to the LED string may be added as well.

BRIEF DESCRIPTION OF THE DRAWINGS

FIGS. 6a and 6b respectively illustrate the operating principle and example architecture configured for auxiliary voltage generation to power the switches and/or the controller or control logic of an LED driver system, in accordance with one example embodiment of the present invention.

DETAILED DESCRIPTION

Solid state lighting systems are disclosed for providing uniform brightness of light emitting diodes (LEDs) serially connected in a string. In some embodiments, the LEDs can be powered directly from the mains such that no switch-mode power supply (SMPS) is needed. In such cases, a linear regulator and switches can be used to control the current through the LEDs to provide uniform brightness. Because there is no SMPS in such cases, there is no need for an SMPS output storage element (e.g., typically a capacitor or sometimes an inductor or a combination of both) or the significant energy storage associated therewith. Other embodiments can be used with a switch-mode based LED driver topology and/or storage elements coupled in parallel with clusters of the LEDs. In any such cases, digital control logic (e.g., microcontroller or other suitable controller) can be used to control the switches accordingly to provide uniform brightness, and some cases, to mitigate the implications of having no SMPS output storage element. In some embodiments, the switching pattern provided by the control logic can be effectively random, although other switching patterns can be used.

General Overview

As previously noted, LEDs and driving circuits can be electrically connected to provide a lighting system. Typical driving circuitry includes an energy storage element such as a capacitor on the driver output. In such typical systems, brightness uniformity of the LEDs in an LED string being powered by the driver can be achieved by using the energy storage elements. These energy storage elements allow an approximately constant current flowing though the LEDs despite the input waveform of voltage and current of the LED driver (in systems using AC mains voltage as the input, power is pulsating with twice the line frequency, even if there is no power factor correction circuit).

Figure 1:
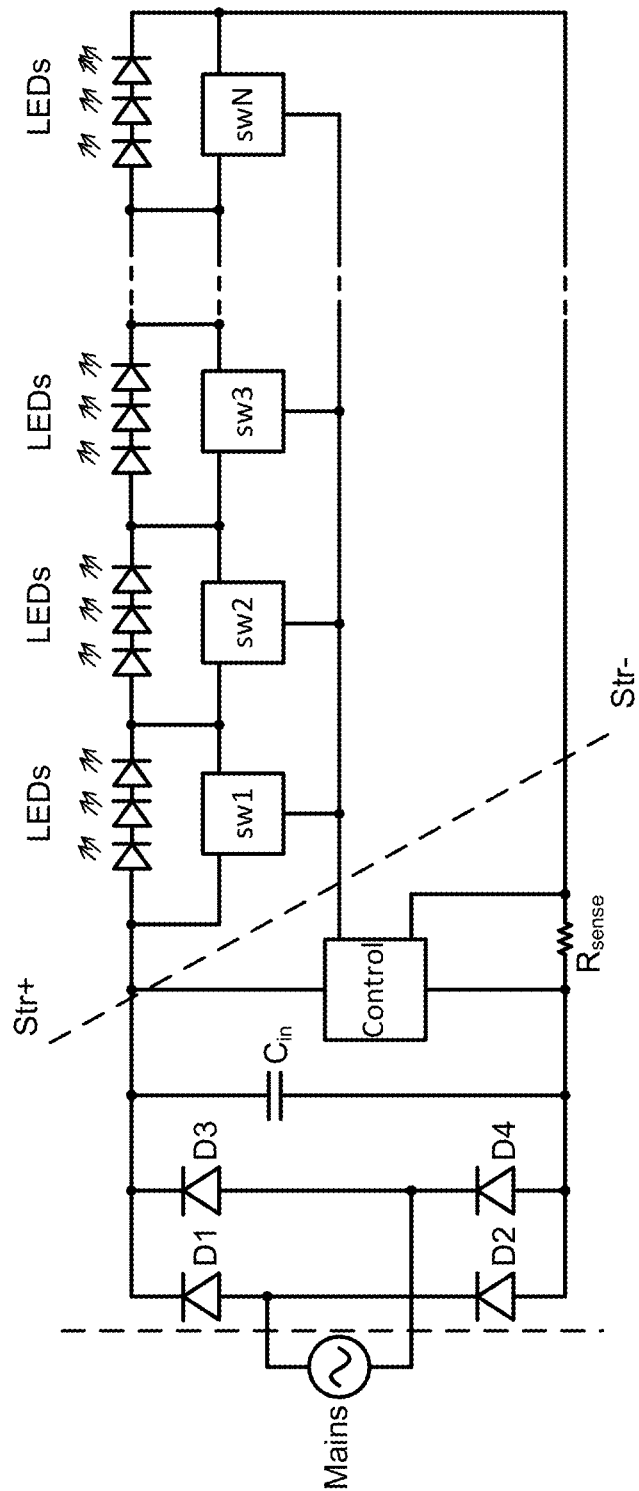
FIG. 1 schematically illustrates a zero energy storage (ZES) LED driver that can be configured and used in accordance with an embodiment of the present invention.

In some cases, the driving circuit can be configured with no energy storage elements, so as to provide a so-called zero energy storage (ZES) configuration. One such example ZES driver circuit for LED strings is illustrated in FIG. 1. As can be seen, a string of LEDs (a series connection of LEDs) is subdivided into N groups (a group, sometimes referred to herein as a cluster, can include a single LED or a bank of LEDs connected in series and/or parallel; the example shown includes three serially connected LEDs per group). The groups are shorted by parallel connected controllable switches sw1, sw2, . . . , swN, which can be implemented with transistor-based or other suitable switching technology. As can be further seen, the switches are responsive to a control circuit, which is configured to sense the current (via $R_{sense}$) flowing through the LEDs and to control the switches depending on the actual voltage value along the sine wave and thereby adjusting the effective length of the LED string to the instantaneous voltage of the line (or supply voltage). The mains or other external source is coupled to a rectifier circuit (D1 through D4 and $C_{in}$). Additional details of ZES driver circuitry can be found in the previously incorporated U.S. application Ser. No. 13/229,611. Such ZES circuit topology can be susceptible to significant brightness difference between the pixels (LEDs) at the beginning of the LED string (close to Str+ in FIG. 1) compared to pixels (LEDs) at the end of the LED string (close to Str− in FIG. 1), assuming identical pixels and numbers of pixels (LEDs) per group. As such, some of the LEDs appear fully lit, some appear dim, and some may be unlit.

Thus, and in accordance with an embodiment of the present invention, the brightness differential can be significantly alleviated by using control logic configured to activate the electronic switches in such a manner that all LEDs appear to have the same brightness and the LED string forward voltage $V_{String}$ closely matches the rectified line voltage $V_{Rectified}$ (e.g., $V_{Rectified} \leq V_{String} \leq 0.9 V_{Rectified}$), or within some other suitable tolerance from $V_{Rectified}$. To this end, the switches in parallel with the LED clusters can be individually addressable by the control logic. In some embodiments, a quasi-random switching pattern is used for controlling these electronic switches. The result of such control can be a more homogeneous brightness impression in the viewer's eyes. To determine the time when the various LED clusters need to be shorted or need to be activated by the switches, the control logic is configured to measure the voltage drop across the clusters, in accordance with one example embodiment. The LED clusters do not need to have the same voltage drop across them (and hence not need to have the same number of LEDs in series). In some such embodiments, the control logic tries to turn on as many clusters as possible so as to reduce losses in the current source. As will be appreciated in light of this disclosure, while the control logic is configured to activate the switches so that all the LEDs appear to have the same brightness and the LED string voltage closely matches the rectified line voltage, some deviation in brightness as well as deviation from the rectified line voltage may be acceptable. To this end, the targeted brightness similarity between LEDs may include an acceptable tolerance (e.g., at any one moment in time, the brightness of brightest activated LED is within 10% or less of the brightness of dimmest activated LED, such as within 5%, or 2%, or 1%). In a similar fashion, the targeted LED string forward voltage drop match to available line voltage may include an acceptable tolerance (e.g., at any one moment in time, the LED string forward voltage drop is within 20% or less of the available line voltage, such as within 10%, or 5%, or 2%, or 1%).

In some embodiments of the present invention, the switching techniques can be used with an LED circuit having no significant energy storage in the driver circuit (e.g., no SMPS output capacitor) so as to efficiently illuminate all LEDs of an LED string, so that all LEDs of the LED string appear uniformly bright. This feature also holds for operating the LED circuit on a phase cut dimmer. The LED circuit may also be employed to minimize temperature differences between the individual LEDs of the string. The LED circuit can be operated on AC voltage (e.g., mains) as well as DC voltages of both polarities. As previously explained, the LED string can be, for example, a series connection of clusters (utilizing serial and/or parallel connections) of LEDs. Other embodiments of the present invention may be used with energy storage devices in the driver circuit (e.g., capacitor in parallel with LED clusters) to provide one or more benefits described herein including uniform brightness in some such cases, as will be appreciated in light of this disclosure.

In addition to providing uniform brightness appearance of all LEDs and therefore overcoming the issue of having bright, dim and unlit LEDs, a number of other benefits associated with the switching techniques will be apparent in light of this disclosure, depending on the lighting driver configuration. For instance, a driver circuit that has no energy storage components (e.g., inductors and capacitors, especially no electrolytic capacitors) in the output stage is more likely to exhibit long life, and further enjoys a compact design (especially if a portion of the electronics are implemented in an integrated circuit, as can be done) and competitive cost position. In addition, the switching scheme configured in accordance with some embodiments can result in a highly uniform time-averaged power dissipation of each LED, eliminating hotspots. Assuming an adequate design, this will in turn lead to an increased reliability due to reduced thermal stress. Also, as there are no or fewer dark LEDs, the number of active LEDs (which effectively share the thermal load) is increased. With an increased number of LEDs, their respective temperatures are reduced leading to increased efficiency (due to reduced influence of the thermal droop). In addition, putting more LED clusters into the a lighting circuit configured as described herein (effectively over-sizing with respect to the number of clusters) can actually result in increased lifetime due to less operating time of the individual LEDs as well as increased efficiency due to reduced temperature of the individual LEDs, albeit at the cost of increased power dissipation.

Circuit Architecture

As previously explained, to overcome the issue with bright and dim LEDs (or more generally, non-uniform brightness), individually addressable switches can be used in parallel to each LED (or bank of LEDs) that are turned on and off in a pattern, in accordance with some embodiments. The pattern is configured such that the string forward voltage determined by number of LEDs which are on at a particular instance in time closely matches the mains voltage. The number of LEDs which are on can be determined, for example, by the corresponding switches being off. The pattern can be generated by control logic, which can be implemented, for example, using a microcontroller having processing capability and a number of embedded routines for carrying out the functionality as described herein. Alternatively, the microcontroller may be configured with hardware to carry out the various functions. Alternatively, the control logic can be implemented with gate-level logic or purpose-built semiconductor, such as an application specific integrated circuit (ASIC) or field programmable gate array (FPGA). In a more general sense, the control logic can be implemented with any combination of software, firmware and/or hardware. Numerous control logic schemes and configurations will be apparent in light of this disclosure.

Figure 2A:
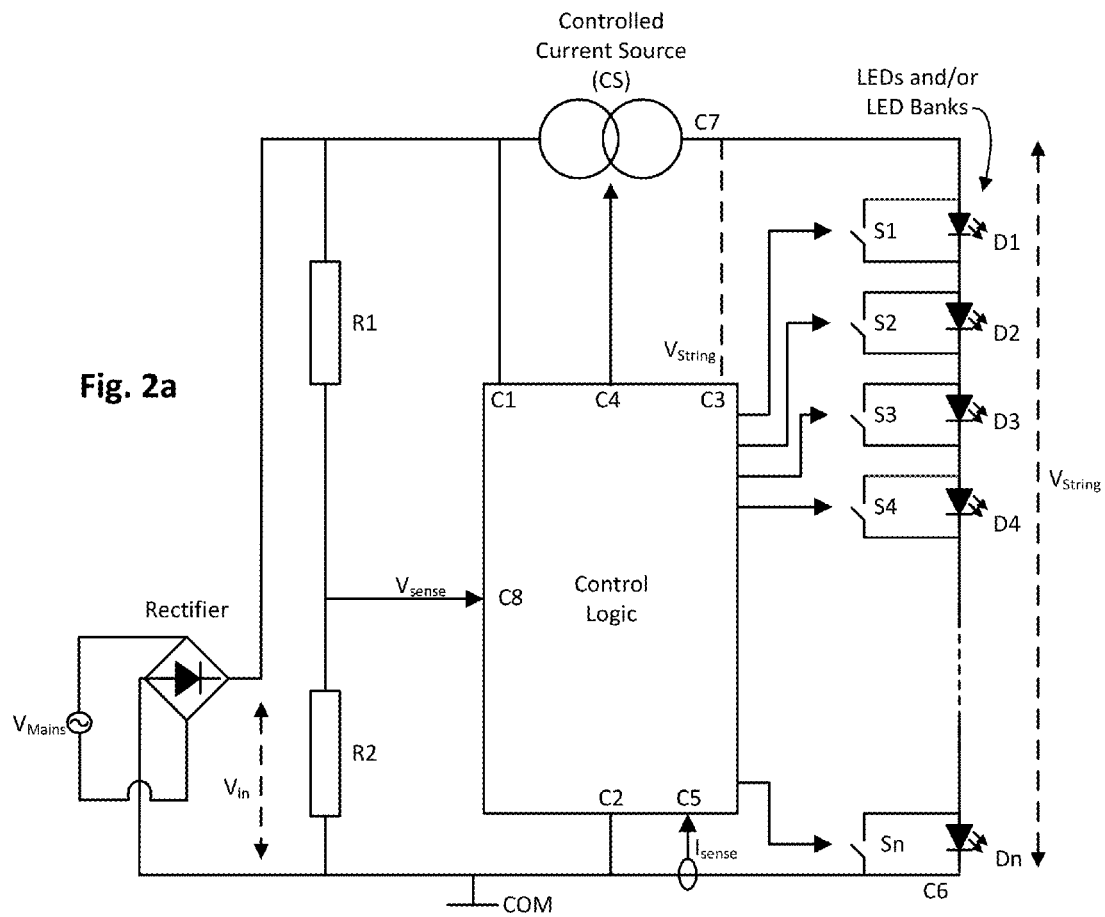
FIG. 2a schematically illustrates a lighting system configured in accordance with one example embodiment of the present invention.

FIG. 2a schematically illustrates an LED driver system configured in accordance with one example embodiment of the present invention. As can be seen in this example case, the LED drive circuitry is fed by a rectified version of an AC power source ($V_{Mains}$). The LED string being driven includes a plurality of LEDs and/or LED banks (D1 through Dn), each electrically coupled in parallel with a corresponding electronic switch (S1 through Sn) that is individually controllable by the control logic. An LED bank may include any number of LEDs connected in series and/or parallel, and an LED cluster may include one or more LEDs and/or LED banks. The control logic also controls a current source (CS), and can sense the current flow, $I_{sense}$. As will be appreciated in light of this disclosure, the string voltage $V_{string}$ (shown as dashed line) can be measured by the control logic to optimize switching (and minimize the voltage drop across the controlled current source). It is desirable to minimize the voltage drop across the controlled current source (particularly if the current source is based on a linear regulator) because this voltage means power loss in the current source and hence reduces efficiency. The voltage across the current source is $V_{in}$−$V_{String}$. Note that $V_{in}$ can also be measured by the control logic, using the voltage divider R1-R2 which creates the signal $V_{sense}$.

To be able to determine the time when the various LED clusters need to be shorted or need to be activated by the switches, the control logic takes the voltage drop across the clusters into account, in accordance with one example embodiment. This may be accomplished, for example, by actual measurement or by estimation based on theoretical and/or empirical analysis. The LED clusters do not need to have the same voltage drop across them (and hence not need to have the same number of LEDs in series). In some embodiments, the control logic is configured to turn on as many LED clusters as possible to reduce losses in the current source. The string voltage $V_{String}$ is generally below but very close to the rectified input voltage $V_{in}$, in accordance with some embodiments.

During operation, the voltage drop of each currently active LED cluster can be measured by, for example, shunting it through the accompanied switch and measuring the increase of $V_{String}$. If this method is continuously applied, the V-I characteristic for each LED cluster can be determined and stored in the control logic (or in some other suitable memory location) for the future reference and operation. As the overall temperature of the circuit/system may change, these measurements can be repeated from time to time (e.g., based on a pre-set schedule, and/or when a temperature change that exceeds a pre-set threshold is detected by the control logic or other circuit).

If it is not desirable to measure the voltage drop of each cluster (e.g., in cases where no measuring capability for $V_{String}$ is provided to save cost), then the control logic can be configured to estimate the voltage drop. In one such example embodiment, a constant voltage drop can be assumed, such as the maximal possible voltage drop considering binning, maximum current and most extreme temperature, for a given application. Note that there could be a single voltage drop value used for all clusters. Another embodiment may approximate the voltage drop based on measured temperature. In such an embodiment, for each cluster the voltage drop including its temperature dependency may be known by or otherwise available to the control logic. In such cases, the control logic could be configured to measure the temperature of the clusters. This can be done, for example, by using one or more temperature sensors per cluster to provide an average temperature of the LEDs in the particular cluster; in other such embodiments, a single temperature sensor can be used for the whole LED string. The temperature sensor may be located, for example, inside the control logic or otherwise available to the control logic for reading temperature. In some such cases, the control logic could know or otherwise have access to information including the temperature relationship between the LED strings, or even the LED clusters and the control logic (e.g., based on empirical and/or theoretical temperature data). As such, the control logic could be configured to estimate the temperature of the individual LED cluster without actually measuring it.

Even though the input voltage $V_{in}$ might not change significantly, additional switching actions can be carried out using timers (e.g., such as Timer TMR_TMax as will be discussed in turn). This helps to uniformly spread the heat among the LEDs as well as have a uniformly brightness appearance in case of, for example, low line frequencies (or in case of a DC voltage input, which is sometimes used to signal the lighting equipment to switch to emergency lighting mode), in accordance with some embodiments.

As an alternative to using a linear regulator in series with the switches and LEDs (such as the controlled current source CS), all the switches in parallel to unused/unlit LED clusters can be used in linear operation rather than in switch-mode operation (e.g., such as the case where the switches are implemented with field effect transistors; or in the case where the switches are implemented with bipolar junction transistors, these switches could be operated in the active region rather than in the saturated region). These switches operated in linear operation form a bypass around the unused LED clusters and at the same time are used as a linear regulator to control the current through the LEDs that are in use at the time. By using this type of control, one could eliminate the use of a dedicated linear regulator, but with the cost of a more elaborate driving circuitry for all the switches, as gate voltages or base currents need to be controlled more precisely, as will be appreciated.

In order to have uniform (time-averaged) brightness of all LEDs over long time periods (e.g., years in which the LEDs may age), it is possible to change the probability of each cluster switch over time depending on the lumen hours created by the related LED clusters in the past. Such aging compensation can be used, for example, if clusters show different changes in luminous efficiency over time (e.g., one cluster heats up stronger than others and thus this particular cluster has decreased efficacy and may—due to the action of proposed aging compensation—have a higher probability to be emitting light than the other clusters). As will be appreciated in light of this disclosure, if all LED cluster age in the same way, then such aging compensation need to be considered, in accordance with some embodiments.

Figure 2B:
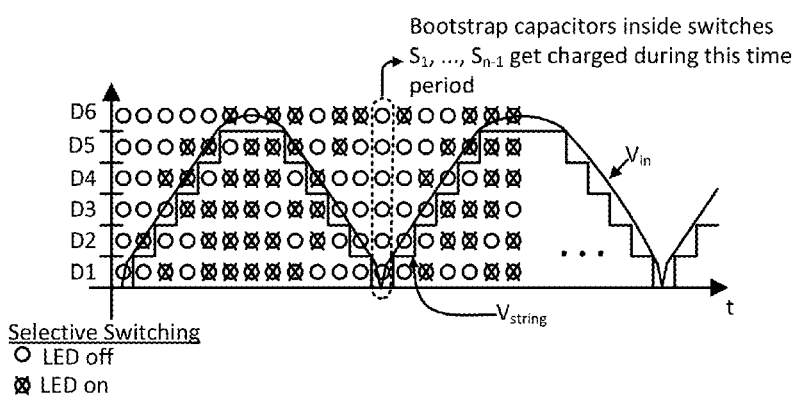
FIG. 2b graphically illustrates the operating principle of the system shown in FIG. 2a, in accordance with an embodiment of the present invention.

FIG. 2b graphically illustrates the operating principle of the system shown in FIG. 2a, in accordance with some embodiments. Unlike a conventional driver where all LEDs would be on, the selective switching scheme provided by the control logic only turns certain LEDs on at any given time. Example timing (for n=6) of a random pattern of switching is shown. As can be further seen in this example embodiment, bootstrap capacitors inside switches $S_1, \ldots, S_{n-1}$ get charged during this time period when no switches are on when $V_{in}$ is at the zero-crossing (~0 VAC). This bootstrap concept will be discussed in further detail in turn, such as with reference to FIG. 5.

Figure 3A:
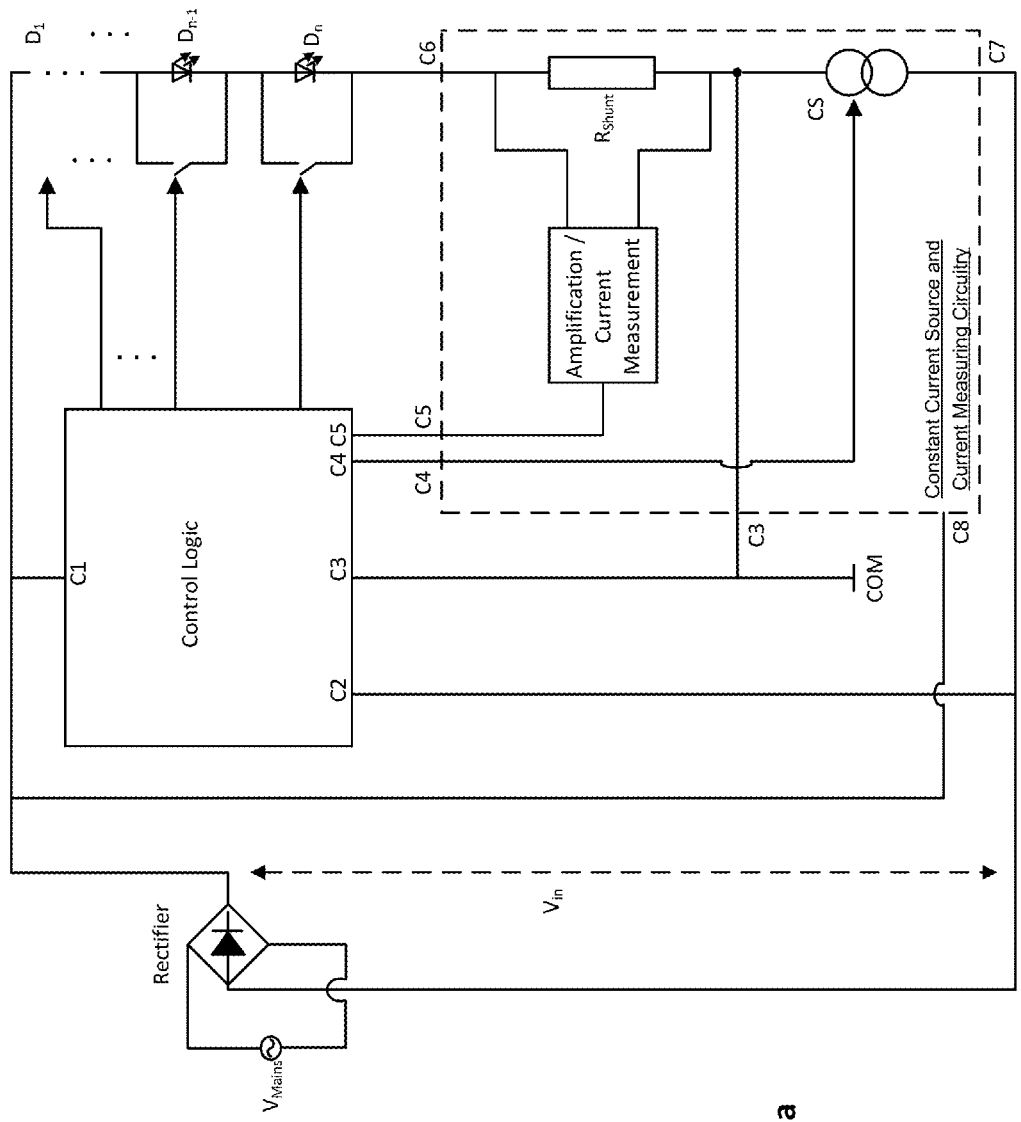
FIG. 3a schematically illustrates a lighting system configured with a constant current source and current measuring circuitry, in accordance with one example embodiment of the present invention.

FIG. 3a schematically illustrates a lighting system configured in a similar fashion to the system of FIG. 2a, but with an alternate combination of the series connection of LED string, constant current source and current measuring circuitry, in accordance with another example embodiment of the present invention. In particular, note that the sequence of LED string, current sensing and controlled current source in the power path has been swapped. Nevertheless the power path still consists of those elements but in changed sequence. This enables the placement of the common (COM) between the current source and the current measuring circuitry. Having both parts of the circuit referenced to common in some cases may be favorable as it simplifies the control logic as all the signals are ground referenced (e.g., no level-shifting is needed for analog signals at all). In addition, the configuration shown in FIG. 3a may be easier to implement because the current source is not a high-side current source as in the embodiment of FIG. 2a.

As can be seen with respect to FIGS. 2a and 3a, the control circuitry (control logic and supporting circuitry) includes a number of connections, including those generally labeled C1 through C8. As can be further seen: connections C1, C2 and C8 allow the control circuitry to measure $V_{in}$ as well as to supply/generate its own regulated internal supply; connections C1-C3 (FIG. 2a) or C2-C3 (FIG. 3a) allow the control circuitry to measure voltage drop across current source; connection C4 allows the control circuitry to set current (via controlled current source CS); connection C5 allows the control circuitry measure the actual current through the LED string ($I_{sense}$); connection C6 refers to the end-of-LED-string; and connection C7 refers to the end-of-current-source. C2 in FIG. 2a and C3 in FIG. 3a refer to COM (which might be connected to ground, or other reference potentials).

Figure 3B:
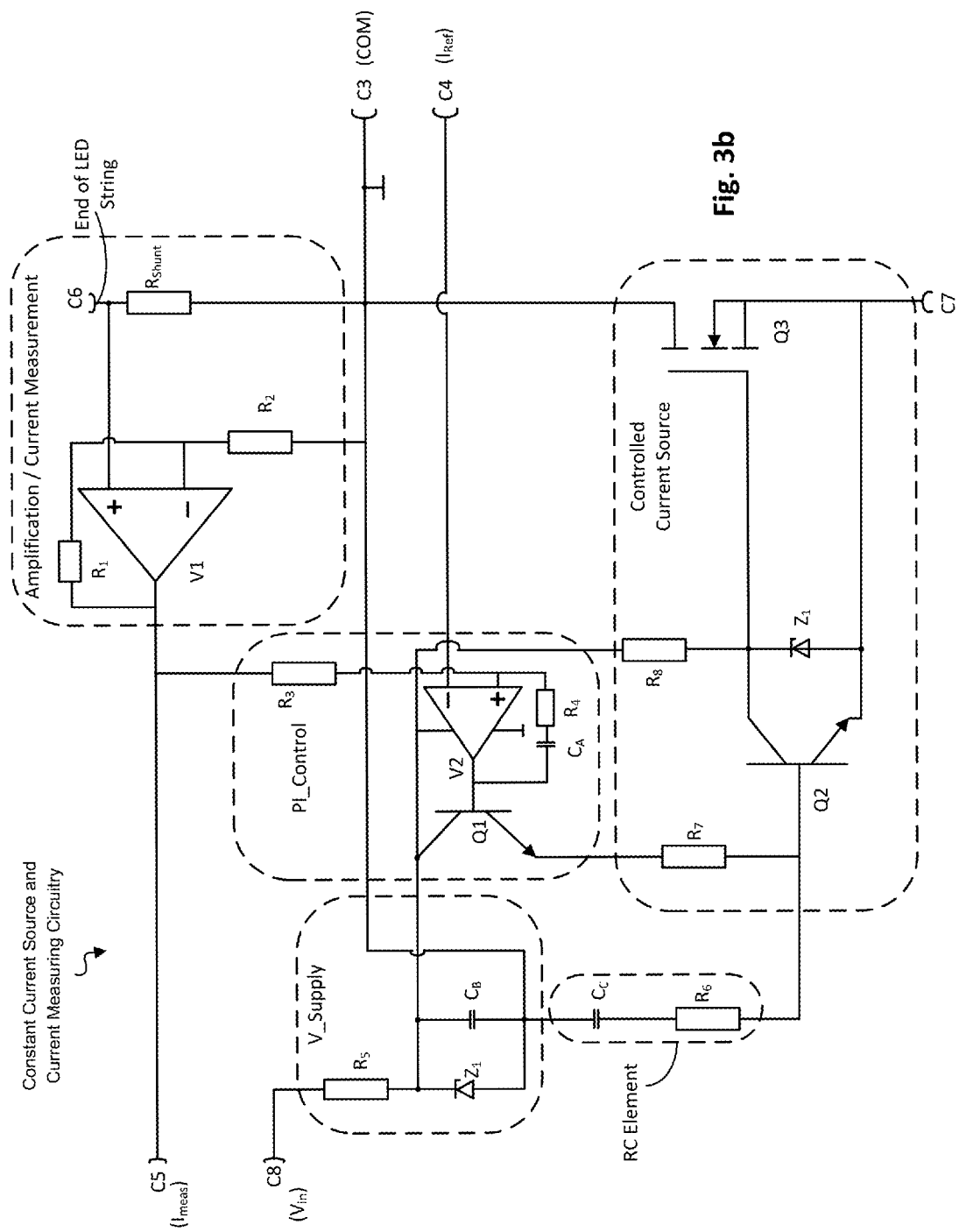
FIG. 3b schematically illustrates further details of the constant current source and current measuring circuitry shown in FIG. 3a, in accordance with one example embodiment of the present invention.

As can be further seen, the constant current source and current measuring circuitry includes an amplification and measurement circuit connected across $R_{shunt}$, and is implemented outside the control logic in this example embodiment. In other embodiments, this circuitry may be implemented within the control logic, if so desired. Various degrees of integration can be used, as will be appreciated in light of this disclosure. FIG. 3b schematically illustrates further details of the constant current source and current measuring circuitry, in accordance with one example embodiment of the present invention. As can be seen, the circuit includes two operational amplifiers V1 and V2 (e.g., dual op-amp package). Op-amp V1 is configured as a non-inverting amplifier with gain set by $R_1$ and $R_2$, for current measurement and amplification of the voltage drop across $R_{shunt}$. Op-amp V2 is configured for proportional-integral (P-I) control with input resistance $R_3$ and feedback including $R_4$ and $C_A$. Transistor $Q_1$ is shown in the PI_Control circuit, but could also be shown in the Controlled Current Source circuit, as it operates in conjunction with resistors $R_7$ and $R_8$, transistor $Q_2$ to provide the control signal to transistor $Q_3$. In this example case, transistor $Q_3$ is implemented with a metal oxide semiconductor (MOS) transistor, and is configured to operate in linear mode acting as a current source. The V_Supply circuit provides power to the circuit, derived from the input voltage $V_{in}$, and includes resistor $R_5$ and capacitor $C_B$ and zener diode $Z_1$ to set the desired level of the supply voltage. The RC-element includes capacitor $C_c$ and resistor $R_6$ and can be used to improve surge response (no relevance for 120 Hz line fluctuation), and zener diode $Z_2$ can be used to limit $V_{Gs}$ of transistor $Q_3$ ($Z_2$ can be, for example, a 10V-zener diode). Numerous variations will be apparent in light of this disclosure, and the claimed invention is not intended to be limited to the example configurations provided herein.

Figure 4:
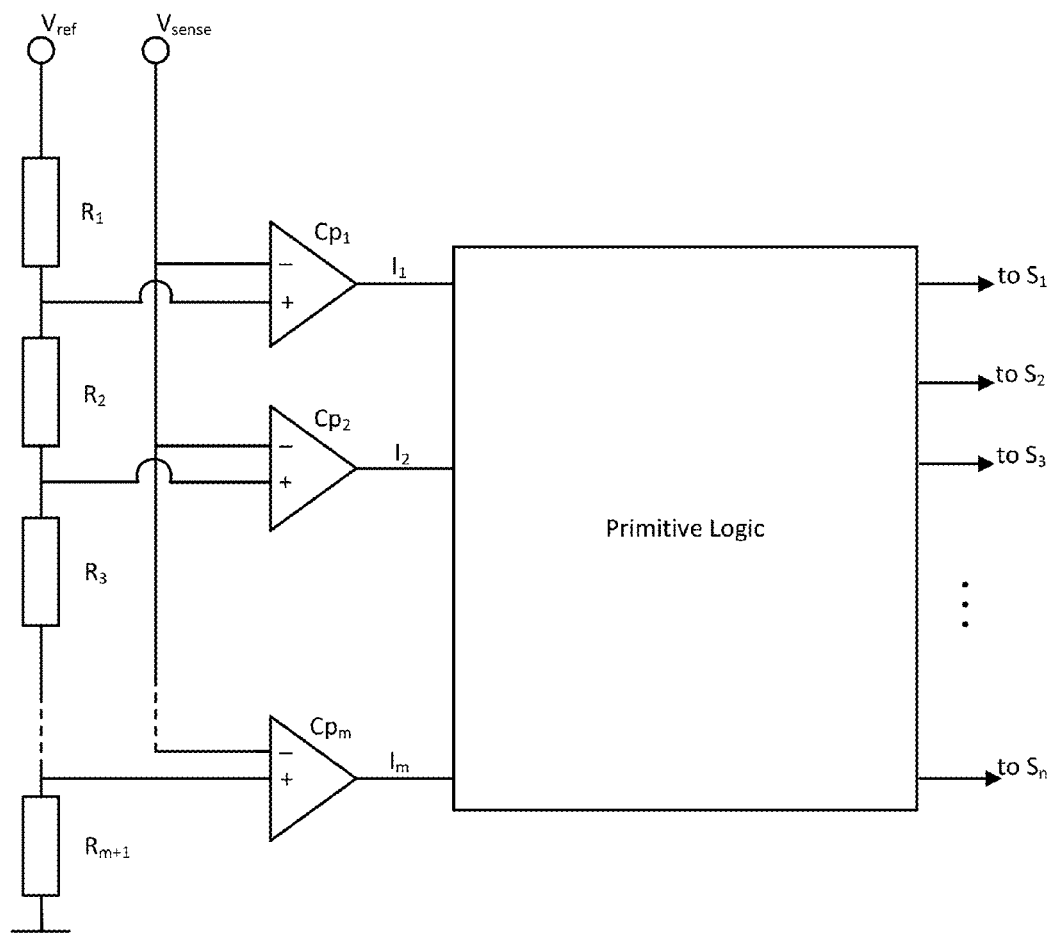
FIG. 4 illustrates example architecture configured to generate a random switching pattern, in accordance with one example embodiment of the present invention.

Any switching pattern that generates a uniform time-averaged brightness of all LEDs may be used to achieve the desired effect of having uniformly lit LEDs, in accordance with an embodiment of the present invention. This might be, for example, a pseudo-random pattern that is generated by a random generator (e.g., by use of a shift-register in a closed-loop XOR connected fashion or replaying a stored or previously recorded data stream), or predefined switching pattern that just depends on $V_{sense}$. FIG. 4 illustrates one example architecture for generating a random switching pattern, in accordance with one example embodiment of the present invention. As can be seen, this particular circuit is configured to create a predefined switching pattern based on $V_{sense}$, and may be implemented, for example, within the control logic, and includes a voltage divider network ($R_1$ through $R_{m+1}$) for providing input to m comparators ($Cp_1$ through $Cp_m$), and primitive logic (e.g., uses NAND and NOR gates, with no clocking, memory, and is not a state machine).

By choosing appropriate Boolean expressions for $S_1, \ldots, S_n$ depending on the input signals $I_1, \ldots, I_m$, a (quasi-)random switching pattern is generated. For a sinusoidal $V_{AC}$, this results in a switching pattern that repeats itself each half cycle and within T/2 it is symmetrical to T/4 (a quarter of the mains period). This is a relatively inexpensive realization but it may be limited with respect to randomness. In addition, it doesn't exhibit additional switching, wherein the additional switching refers to embodiments wherein even though the line voltage doesn't change much (the number of LEDs that need to be on remain the same in such a time period), there is still switching action due to time-based switching (in addition to line-voltage based switching). As long as all the LEDs are of the same color, it is intended that the targeted probability of the random pattern is equal, such that each LED or LED bank has the same probability to be on, which leads to the fact that averaged over a sufficiently large number of line cycles all LEDs will be on for about the same amount of time. Thereby all clusters/LEDs appear to have the same brightness. In case of different colored LEDs (e.g., for a Brilliant Mix configuration which uses amber and mint LEDs, or RGBY-4 color-tunable LEDs), the probability is used for color point steering: all clusters having the same color (could be the result of mixing different colored LEDs) have the same turn-on/off probability. As will be appreciated, the term "Brilliant Mix" refers to a technique by OSRAM Opto Semiconductors for generating white light with a high color rendering index for general lighting applications with LEDs, and the term RGBY-4 refers to red, green, blue, and yellow.

Figure 5:
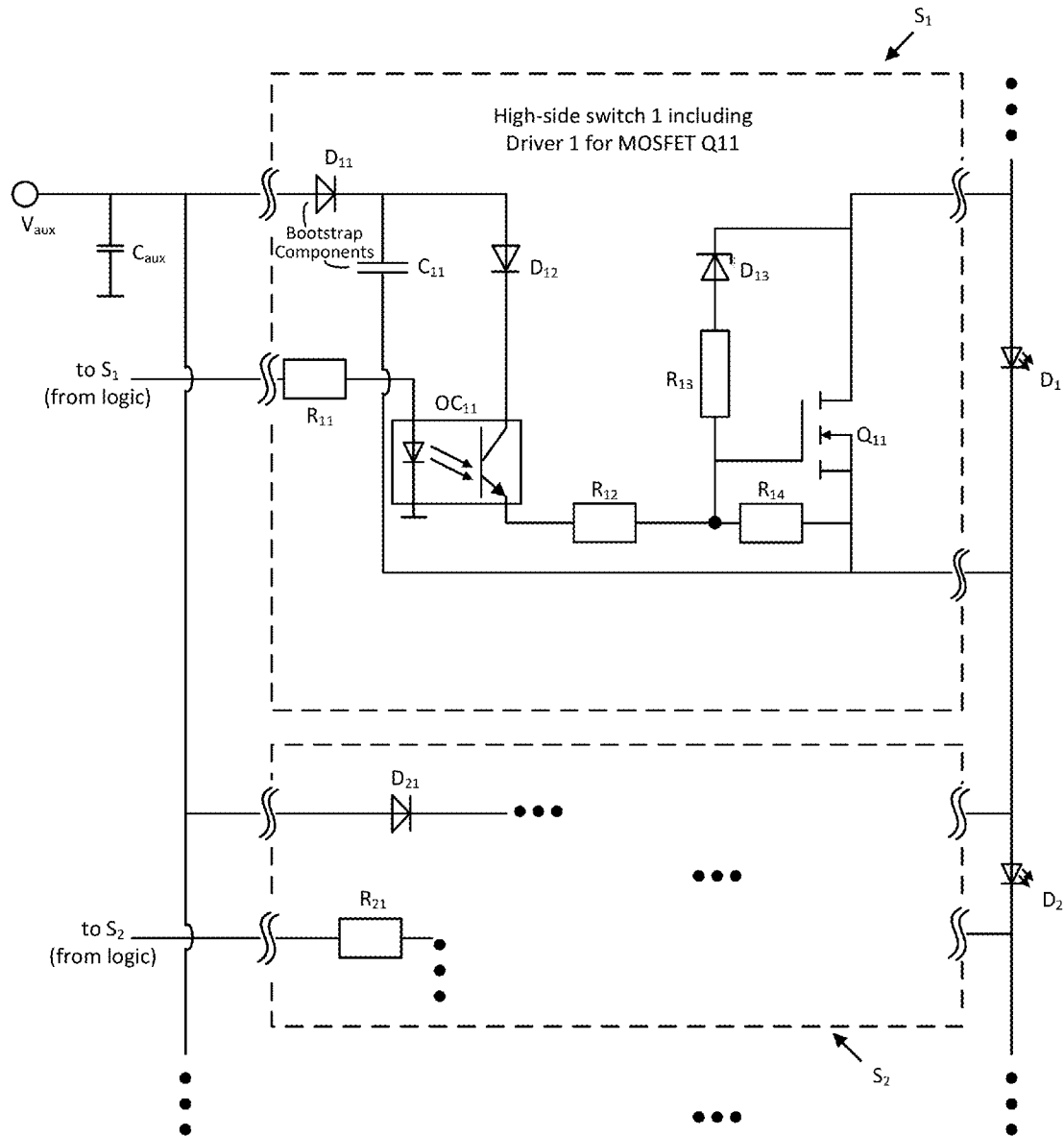
FIG. 5 illustrates example switch architecture that can be used to implement an LED driver system configured in accordance with one example embodiment of the present invention.

FIG. 5 illustrates example switch architecture that can be used to implement an LED driver system configured in accordance with one example embodiment of the present invention. As can be seen, the high-side switches are floating and include $S_1, \ldots, S_{n-1}$ (or $S_1, \ldots, S_n$, depending on the implementation). Each high-side switch includes driver for a MOSFET (e.g., $Q_1$, etc). To power the floating switches, a bootstrap concept is used. In more detail, every time the switch is on GND (or COM) potential, a capacitor (e.g., bootstrap capacitor $C_{11}$) is charged (e.g., through a bootstrap diode $D_{11}$) up to the voltage of a ground/COM referenced auxiliary voltage source $V_{aux}$. $C_{aux}$ is a filter capacitor and $R_{11}$ is a bias or current limiting resistor. The charged capacitor then provides the energy to drive the gate of the switching transistor (e.g., $Q_{11}$). To ensure proper operation of the circuit at power-on, the control logic can be configured to turn on all switches for a sufficiently long time, regardless of $V_{sense}$, so that all bootstrap capacitors are charged up, in accordance with an embodiment. In this example case, the driving of the gate of $Q_{11}$ is realized by the optocoupler $OC_{11}$. When the input signal $S_1$ is high, $Q_{11}$ is turned on as the optocoupler is active and hence the gate of $Q_{11}$ gets raised above the threshold voltage through diode $D_{12}$, $OC_{11}$, and $R_{12}$. If $S_1$ goes to low, the optocoupler is not allowing anymore current to flow and $R_{14}$ pulls the gate of $Q_{11}$ low.

With further reference to the example embodiment of FIG. 5, note that failure of an LED in the string will not cause the circuit to malfunction. In particular, each switch $S_1, \ldots, S_n$ has a detection circuit and if the voltage across the switch gets too high under normal operating conditions (because one or more LEDs in parallel to the respective switch is malfunctioning, such as LED fails open) the detection circuit causes the switch to close (thereby by-passing the defective cluster). In order to still create light, even though there is in open in one of the LED strings, this particular string gets shorted out by the adjacent switch which is there anyways. This additional feature turning the switch on at high switch voltages is implemented by zener diode $D_{13}$ and resistor $R_{13}$ in this example embodiment. The zener voltage of $D_{13}$ is chosen to be higher than the regular forward voltage of the dedicated LED cluster under normal operating conditions. Numerous variations of the example circuitry shown will be apparent in light of this disclosure. For instance, note that high voltage transistors can be used for signaling, instead of opto-couplers $OC_{11}$ . . . $OCn_1$.

Auxiliary Voltage Generation for Switches and/or Control Logic

Figure 6B:
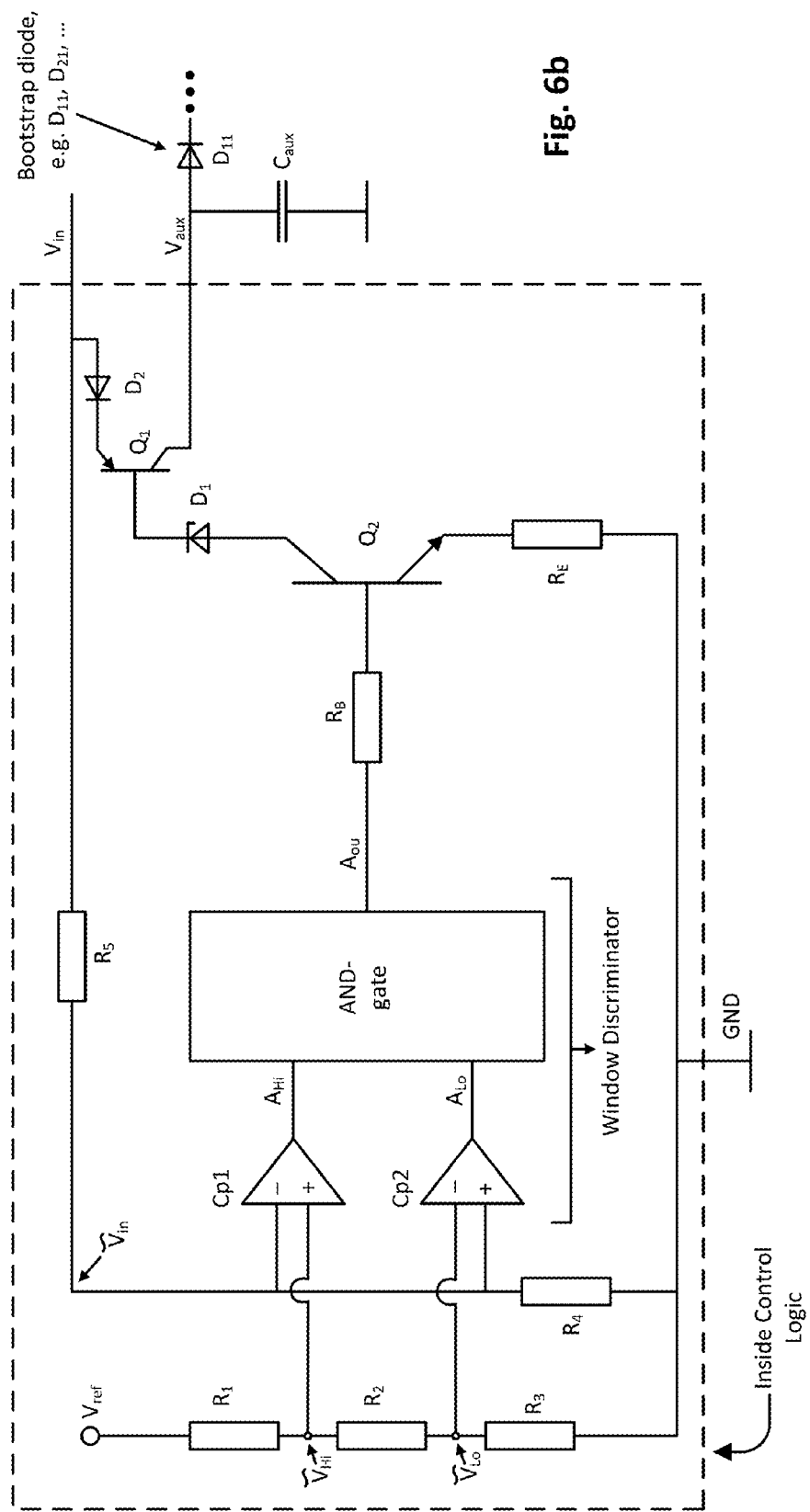

FIGS. 6a and 6b respectively illustrate the operating principle and example architecture configured for auxiliary voltage generation to power the switches and/or the controller or control logic of an LED driver system, in accordance with one example embodiment of the present invention. As can be seen with respect to FIG. 6a, the voltage $V_{aux}$ can be generated from $V_{sense}$ or directly from $V_{in}$, in accordance with some embodiments. The example embodiment shown in FIG. 6b assumes $V_{in}$. In other embodiments, note that a dedicated linear regulator could be used to generate $V_{aux}$ if so desired, but such a configuration would generally be less efficient. In general, the technique used here effectively involves a linear regulator that works only when the line input voltage is in a certain range while the linear regulator has a somewhat good efficiency and stores energy with a capacitor. As further shown in FIG. 6b, the linear regulator can be implemented, for example, within the control logic.

In more detail, FIG. 6a shows a graph of the instantaneous line voltage $V_{in}$ (or $V_{sense}$, as the case may be) over time and the switching periods of the controlled switch $Q_1$ of FIG. 6b, according to one embodiment of the present invention. In this graph, $V_{in}$ is shown passing through the threshold voltages $V_{Hi}$ and $V_{Lo}$ while increasing during interval time slot 1 and while decreasing in value during time slot 2. During time slot 3, $V_{in}$ is above the upper threshold voltage value $V_{Hi}$ while during interval time slot 4, $V_{in}$ is below the lower threshold voltage value $V_{Lo}$. In one example embodiment, the switching periods of the switch may be configured such that the switch is closed when the line voltage is between the two threshold voltages $V_{Hi}$ and $V_{Lo}$ (i.e., closed during time slots 1 and 2). In such an embodiment, the linear regulator is only operating during periods of high efficiency.

In the example shown in FIG. 6b, the circuitry includes resistor $R_5$ for scaling the value of $V_{in}$ (or $V_{sense}$, as the case may be) inside the control logic (e.g. integrated circuit or chip set, such as microcontroller, ASIC, FPGA, etc). A reference voltage $V_{ref}$ is also provided, along with resistors $R_1$, $R_2$, and $R_3$ that act as voltage dividers and whose values determine the lower threshold voltage $V_{Lo}$ and upper threshold voltage $V_{Hi}$ (both scaled inside the control logic; note that the '~' indicates scaled values) of a window discriminator circuit comprising comparators Cp1 and Cp2 and an AND gate. The line voltage $V_{in}$ is connected to comparators Cp1 and Cp1, and also to resistor $R_4$. The output of the comparators Cp1 and Cp2 ($A_{Hi}$ and $A_{Lo}$, respectively) is sent to an AND gate, in this particular example, and the output of the AND gate ($A_{out}$) is sent to transistor $Q_2$ via resistor $R_B$. The transistor $Q_2$ is connected to ground/COM via resistor $R_E$, and to transistor $Q_1$ via zener diode $D_1$. The output of transistor $Q_1$ provides the auxiliary voltage $V_{aux}$ and is connected to capacitor $C_{aux}$ and bootstrap diode $D_{11}$ in this example embodiment. The emitter of transistor $Q_1$ is connected to the optional diode $D_2$, which protects $Q_1$ from potentially too high reverse voltages. Diode D2 is connected to the line voltage $V_{in}$. In one such case, resistors $R_B$ and $R_E$ along with the current-gain β of transistor $Q_2$ operate to limit the inrush current through transistor $Q_1$ at the start-up (if capacitor $C_{aux}$ is empty or completely discharged) and also operate to limit any current spikes at the beginning of time slot 2.

Figure 6C:
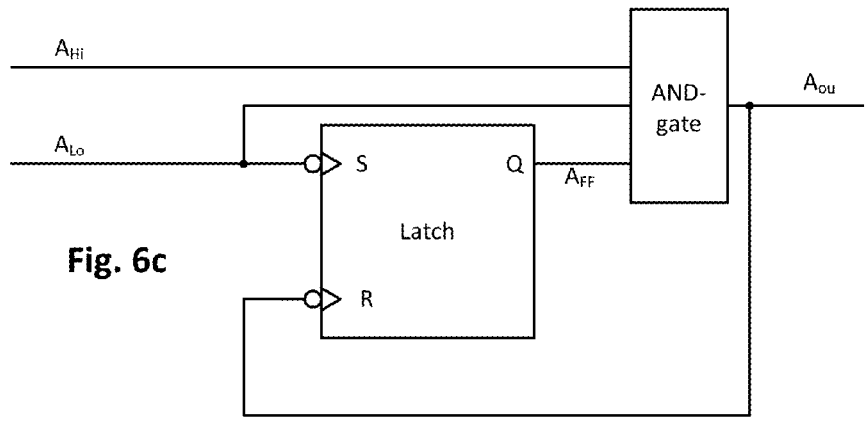
FIG. 6c illustrates alternative componentry that can be used in the architecture of FIG. 6b, in accordance with another example embodiment of the present invention.

In some embodiments, there is the possibility of current spikes at the beginning of time slot 2 if the auxiliary capacitor $C_{aux}$ is significantly discharged during time slot 3. Because of these current spikes, the circuitry may be less efficient during time slot 2 compared to when the line voltage is increasing in time slot 1. Thus, according to one embodiment of the present invention, the linear regulator may be controlled such that it only operates during time slot 1 when $V_{in}$ (or $V_{sense}$, as the case may be) is increasing between the lower and upper threshold voltages $V_{Hi}$ and $V_{Lo}$. Such an example avoids high losses at the beginning of time slot 2. FIG. 6c shows a circuit logic diagram that may be used in a control for a linear regulator switch, according to one embodiment of the present invention. Such an embodiment may be implemented with similar circuitry as shown in FIG. 6b, only with the AND gate being replaced by the logic circuit shown in FIG. 6c. More specifically, the outputs of comparators Cp1 and Cp2 may be sent to the two inputs of the AND gate as shown in FIG. 6c. The output of comparator Cp2 may be sent to S-R latch, which is also fed by the output of the AND gate. The output of the S-R latch is sent to the third input of the AND gate, as further shown in FIG. 6c.

Figure 7A:
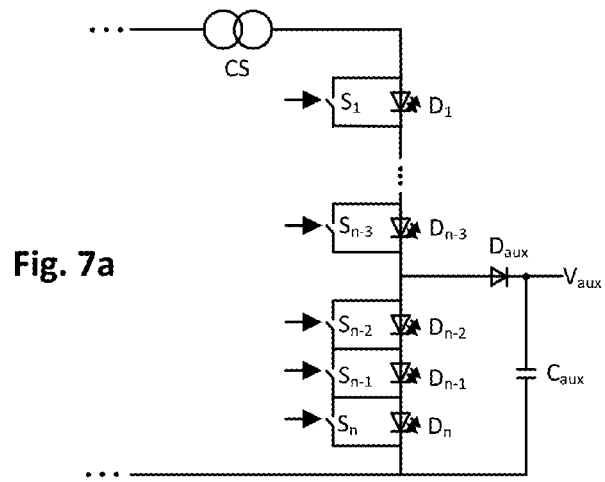
FIGS. 7a and 7b illustrate alternative architectures configured for auxiliary voltage generation to power the switches and/or the controller or control logic of an LED driver system, in accordance with other example embodiments of the present invention.
Figure 7B:
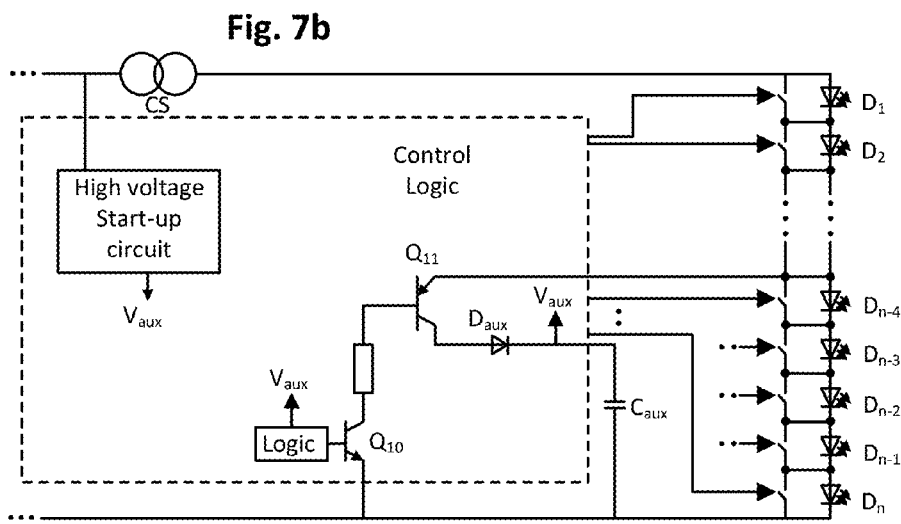

FIGS. 7a and 7b illustrate alternative architecture configured for auxiliary voltage generation to power the switches and/or the controller or control logic of an LED driver system, in accordance with other example embodiments of the present invention. In such example embodiments, the forward voltage drop across LEDs/LED clusters can be used to generate the auxiliary voltage.

With reference to the example circuit shown in FIG. 7a, it is assumed $V_{aux}$ that the voltage across three LED clusters (Dn, . . . , $D_{n-2}$) would be sufficient to generate $V_{aux}$. As will be appreciated, while the lowest three diodes are used in this example case, other embodiments might be, for example, the two lowest or the four lowest diodes, depending on what magnitude the voltage $V_{aux}$ is desired. In such embodiments, note that the startup might be difficult due to a very high voltage drop across $D_1$, . . . , $D_n$. This means it may take quite a while to change $C_{aux}$, which may be undesirable, depending on the given application. In addition, $C_{aux}$ needs to have a sufficiently large capacity due to the fact that $D_n$ and $D_{n-1}$ and $D_{n-2}$ will be turn on only for short time intervals/periods.

The example embodiment shown in FIG. 7b includes a high voltage start-up circuit in the control logic, which can be powered by an internal supply provisioned in the control logic. In such embodiments, the auxiliary voltage $V_{aux}$ is created by utilizing the voltage drop across more than three LED clusters (e.g., 5 clusters in this example case) by turning on $Q_{10}$ and $Q_{11}$ via the logic whenever three or less LED clusters are operating (corresponding switches are open). Thus, the time periods in which $C_{aux}$ is charged are significantly increased and hence a smaller capacity of $C_{aux}$ will be sufficient. The auxiliary voltage $V_{aux}$ is used to power the switches in parallel to the LEDs as well as the control logic.

Methodology/Pseudo Code/Implementation Details

FIGS. 8a through 8e are flow charts illustrating switching control schemes configured in accordance with various example embodiments of the present invention. As previously explained, the switching scheme can be carried out by the control logic, which can be implemented, for example, using one or more microcontrollers, FPGAs, ASICs, or other such suitable circuitry can that can be programmed or otherwise configured to carry out the functionality described herein. Prior to discussing the flow charts, it will be helpful to establish some nomenclature. Table 1 provides example Registers and Variables that may be referred to in the flowcharts. Table 2 provides example Constants that may be referred to in the flowcharts. Table 3 provides example Timers that may be referred to in the flowcharts. Note that all Timers are configured as countdown timers. Table 4 provides example Subroutines that may be referred to in the flowcharts. Note that the tables are merely provided as examples, and other registers, variables, timers, and/or subroutines not included in the tables may also be used, as will be appreciated in light of this disclosure.

TABLE 1

Registers/Variables

| Registers/Variables | Explanation |
| --- | --- |
| OReg | OReg is the output register controlling switches $S_1, \ldots, S_n$. If bits 1 ... n of this register are set, then switch $S_1, \ldots, S_n$ is open, and the corresponding LED clusters $D_1, \ldots, D_n$ emit light. |
| I | Register of D/A converter that puts out the set-value for the current regulator. |
| V_SENSE | holds last measured value of $V_{sense}$ |
| I_SENSE | holds last measured value of $I_{sense}$. |
| V_STRING | holds last measured value of $V_{string}$. |
| V_CS | holds last measured value of voltage across the current source. |
| T | Array of n + 1 temperatures corresponding to LED clusters $D_1, \ldots D_n$ and temperature of current source. |
| TMax | integer number, so that T[TMax] gives maximum of the temperatures. |
| Up | contains numbers of the LED clusters that will be turned on next in case $V_{in}$ rises sufficiently (e.g., Up = 3: $D_3$ will be the next to be turned on). |
| Dn | like Up, just for turning off if $V_{in}$ decreases sufficiently (e.g., Dn = 3: $D_3$ will be turned off next). |
| V_UP | V SENSE needs to increase to or above this value (=V_SENSE needs to increase to at least this value), before switching will happen (to turn $D_{Up}$ on). |
| V_DN | V_SENSE needs to decrease to or below this value, before switching will happen (to turn $D_{Dn}$ off). |

TABLE 2

Constants

| Constants | Explanation |
| --- | --- |
| Const_VF_Guess | Constant that closely reflects the voltage drop across the LED cluster $D_1$ (note that exact value is not critical, as this value is only used for start-up) |
| MAX_INT | Constant representing the max number for an integer variable on this microcontroller (or FPGA, etc). |

TABLE 3

Timers

| Timer | Explanation |
| --- | --- |
| TMR_INT | Triggers interrupt if timer register TMR_INT_REG reaches 0. The purpose of the interrupt routine is to measure the temperatures of the LED clusters and of the current source, and thereafter to update the set value of the current source. |
| TMR_TMax | The Purpose of this timer is to limit the time a particular pattern (pattern = which LEDs are turned on and which are turned off) is displayed. Such additional switchings can be introduced if the line voltage remains within a certain range that does not lead to switching action of S1, . . . , Sn for a certain time. This feature can be helpful for generating randomness/uniform light distribution for operating the circuit from DC (e.g., luminaire is used for emergency lighting → AC is switched to DC when there is a power outage). |
| TMR_Tdc | This timer takes care of the repetitive re-charging of the bootstrap capacitors in the switches. |

TABLE 4

Subroutines

| Subroutines | Explanation |
| --- | --- |
| Rand( ) | The Rand( ) function returns an integer number which is randomly distributed between 1 and n with equal probabilities for all numbers. |
| IV_Meas( ) | Measures $V_{sense}$, $V_{string}$ and $I_{sense}$ through A/D conversion and updates V_SENSE, V_STRING, and I_SENSE. It also calculates V_CS = (R1 + R2)*V_SENSE/R2 − V_STRING (see p. 17). V_CS represents the voltage across the current source. |
| T_Meas(i) | Measures temperature of cluster $D_i$ or if i = n + 1 it measure the temperature of the current source. |
| I_Set (V_SENSE, TMax) | Calculates the new set value for the current regulator. In one implementation I_Set(. . .) only returns a constant value (e.g., this constant can be stored in program memory). I_Set (. . .) may take V_SENSE into account (e.g., return a value that is proportional to V_SENSE → This approach gives excellent power factor). A non-linear de-rating can also be implemented in I_Set (e.g., if V_SENSE or T[T_Max] rise above certain threshold values). |

Figure 8A:
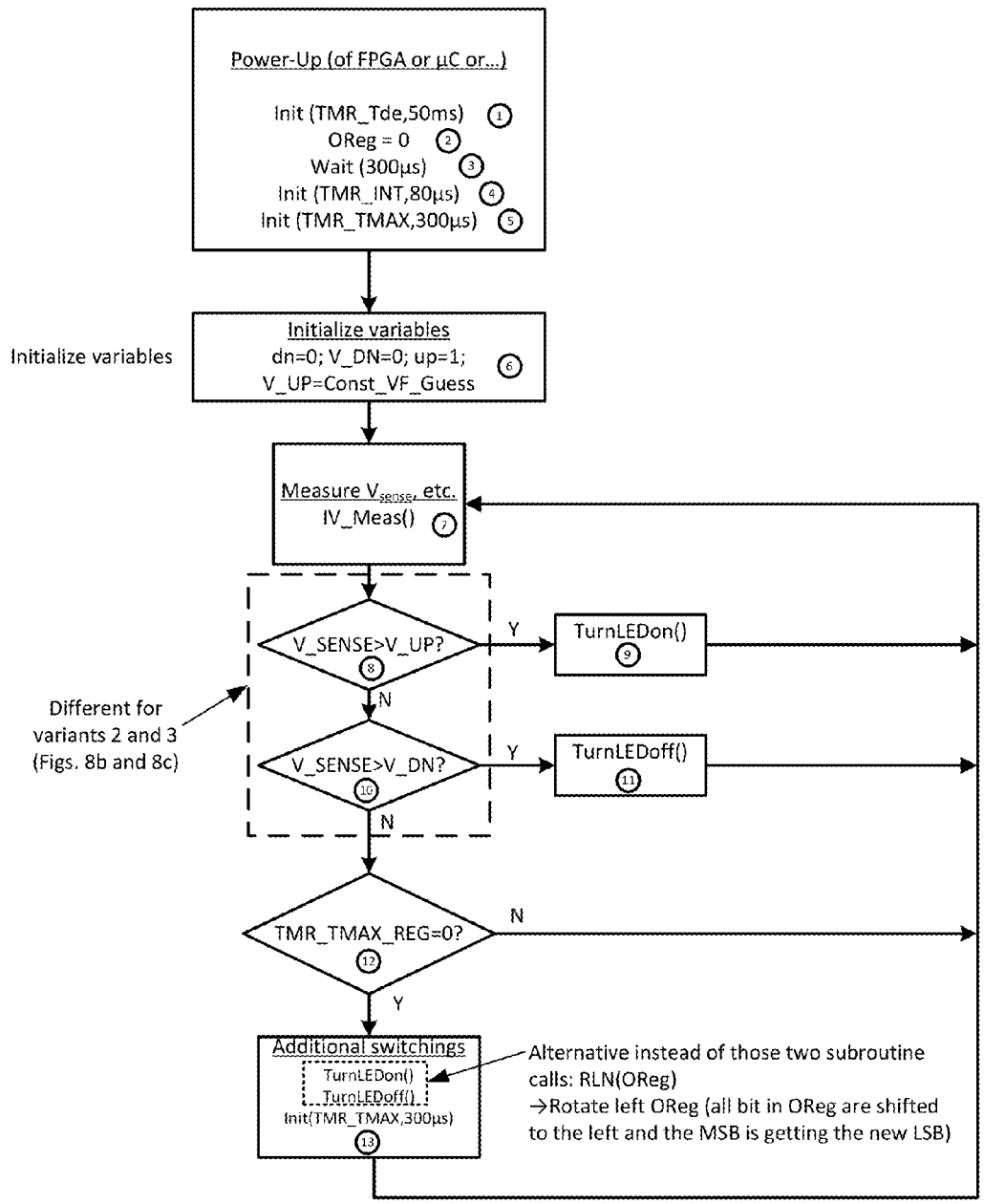
FIGS. 8a through 8e are flow charts illustrating switching control schemes configured in accordance with various example embodiments of the present invention.

FIG. 8a is a flow chart illustrating the structure of a main program for carrying out the switching control, in accordance with various example embodiments of the present invention. As can be seen, each of the boxes of the flow chart includes one or more circled designators (1 through 13 in total). Each such designator is shown in Table 5 with a corresponding explanation.

TABLE 5

Main Program

| Circled Designator | Explanation |
| --- | --- |
| 1 | Initialize and start Timer ensuring the charging of the bootstrap capacitors in dc operation |
| 2 | Write 0 to output register → Turns switches S1, . . . , Sn on |
| 3 | Wait for 300 µs to get Bootstrap Capacitor fully charged |

ISRC)
5
Initialize & start Timer limiting the time in which the switching pattern remains constant
6
Initialize variables dn, V_DN, up, and V_UP
7
Measure $V_{sense}$ and/or other pertinent data (e.g., $V_{in}$, $I_{sense}$, etc)
8
Determine if $V_{sense}$ > V_UP; if so, continue with 9; if not, continue with 10
9
If $V_{sense}$ > V_UP, turn LED on
10
Determine if $V_{sense}$ < V_DN; if so, continue with 11; if not, continue with 12
11
If $V_{sense}$ < V_DN, turn LED off
12
Determine if timer Tmax is finished; if not, continue measuring at 7; if so, continue with 13
13
If Tmax is finished, add additional switchings (particularly useful feature if operated with DC instead of AC)

As can further be seen with reference to FIG. 8a, an alternative to the subroutine calls at 13 may include, for example, an RLN(OReg) command, which rotates the bits of the OReg to the left, such that all bits in OReg are shifted to the left and the most significant bit (MSB) is getting the new least significant bit (LSB). Numerous other variations will be apparent in light of this disclosure.

Figure 8B:
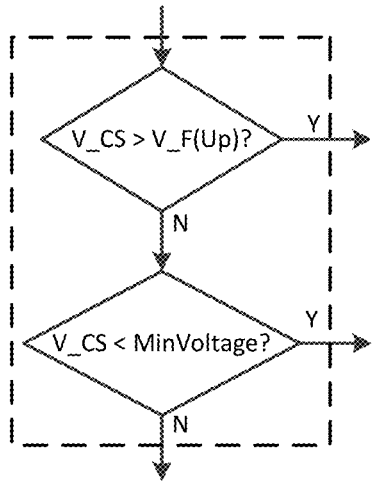

FIG. 8b shows one example variant of the dashed structure shown in FIG. 8a, in accordance with another embodiment of the present invention. As can be seen in this example case, the main program with this variant is performing the same task as the main program of FIG. 8a, but the voltage difference across the current regulator is used in addition to knowledge about forward voltage given by the V_F(i) subroutine, which is discussed in turn. MinVoltage is a constant. It can be chosen such that a minimum voltage across the current regulator (e.g., 0.5V) is maintained all the time. This gives sufficient head room to maintain proper current regulation.

Figure 8C:
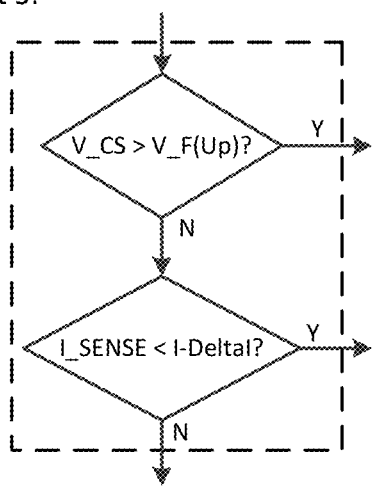

FIG. 8c shows another example variant of the dashed structure shown in FIG. 8a, in accordance with another embodiment of the present invention. As can be seen in this example case, a turning off of an LED cluster is triggered by $I_{sense}$ falling significantly below the set value (e.g., as defined by DeltaI, such to 1 mA) which means that the current source cannot source enough current because too many LEDs are turned on. DeltaI is a constant. It can be chosen such that it represents the allowed regulation deviation (error between actual value and set value) of the current regulator.

Interrupt Service Routine.

The following pseudo code can be used to implement an interrupt service routine.

```
ISR( )
    TMAX = 1
    FOR j = 1,..,n+1                            /Measure temperatures and find max. temp.
        T[j] = T_MEAS(j)                        /Measure temperatures and find max. temp.
        IF T[j] > T[TMax] THEN TMax = j         /Measure temperatures and find max. temp.
    I = I_Set (V_Sense, TMax)                   /Calculate new I set value and set this value
    Init (TMR_INT,80µs)                         /Reset and Restart Interrupt timer
    RET                                         /Return from Interrupt
```

Calculate V_DN and V_UP Routines.

The following pseudo code can be used to implement the calculate V_DN routine.

```
CalculateVdn( )
    V_DN=0

FOR i=1,..,n                                /* Explanation:

IF OReg[i] AND (I<>Dn) *                /If cluster D_i is operating AND won't be THEN V_DN = V_DN + V_F(i)           /turned off as the next cluster then Return                                      /consider forward voltage.
Calculate Vup( )
    V_UP=0
    FOR i=1,..,n                                /* Explanation:
        IF OReg[i] OR (i=Up) *                  /Cluster D_i is operating OR will be
            THEN V_UP = V_UP + V_F(i)           /operating soon (assuming input voltage
    Return                                      /will raise)
```

V_F( ) Routine.

The V_F(i) subroutine calculates the forward voltage of cluster D, depending on temperature T[i] and current I. This is done through linear extrapolation between data points stored in a 3D-lookup table for each cluster $D_i$, in accordance with one example embodiment.

The control logic program (assuming software/firmware implementation, in accordance with some embodiments) may comprise of a self-learning module in which the V-I characteristic of the n LED clusters is learned. Such a training routine call can be incorporated, for example, into the TurnLEDoff( ) routine. The routine could use, for example, $V_{String}$ and the temperature of the LED clusters, and current can be measured before turn off and after turn off. Numerous variations and configurations will be apparent in light of this disclosure. For instance, to make the circuit react faster, analog comparators and timers can be used to perform the same task as the (main) program is doing. An in between solution would be to use a μC with internal analog comparators.

Figure 8D:
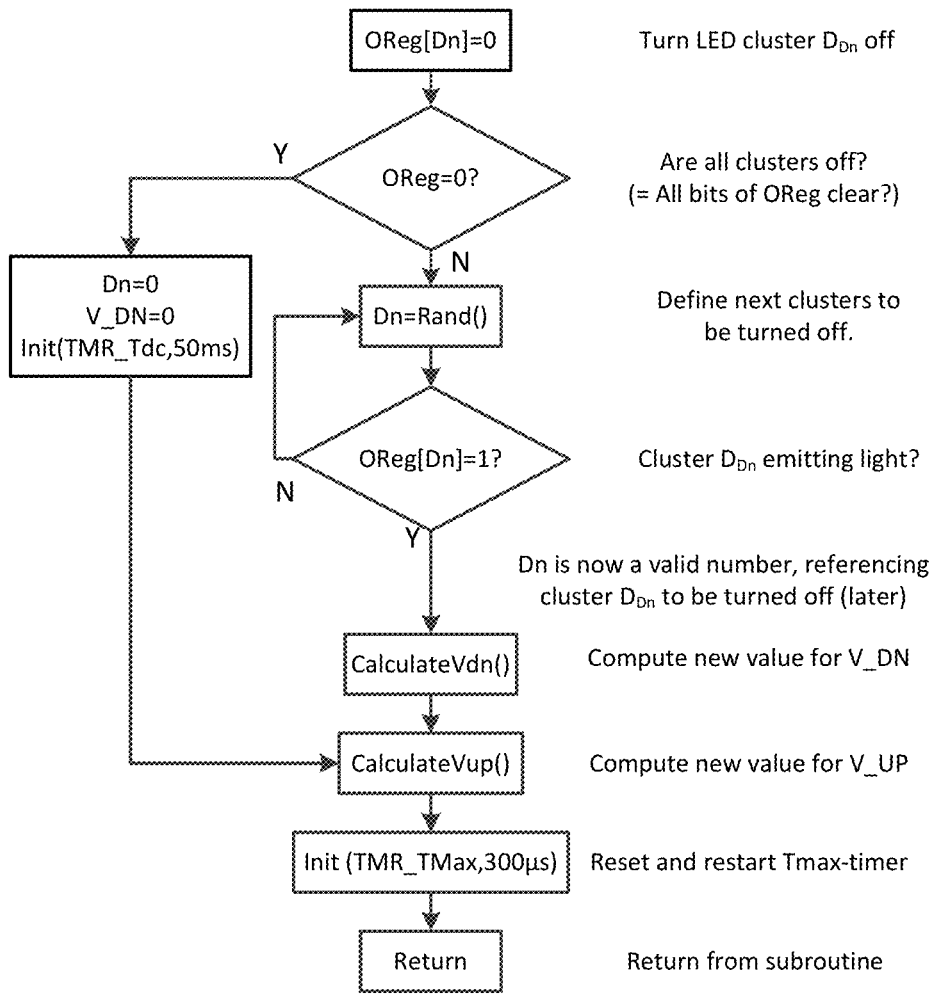

FIG. 8d illustrates the TurnLEDoff( ) routine, configured in accordance with one embodiment of the present invention. As can be seen, the routine includes setting a register to turn LED cluster $D_{Dn}$ off. A determination is then made as to whether all clusters are off (e.g., all bits of OReg clear?). If yes, then reset variables Dn, V_DN, and initial timer TMR_Tdc to 50 milliseconds. If, on the other hand, all clusters are not off, then define the next clusters to be turned off. A determination is then made as to whether cluster $D_{Dn}$ is emitting light. If not, then define the next cluster to be turned off. If, however, cluster $D_{Dn}$ is emitting light, then Dn is now a valid number, referencing cluster $D_{Dn}$ to be turned off (later), and continue with computing a new value for V_DN. The method continues with compute a new value for V_UP, as well as resetting and restarting the Tmax-timer. A subroutine return can then be processed back to main program.

Figure 8E:
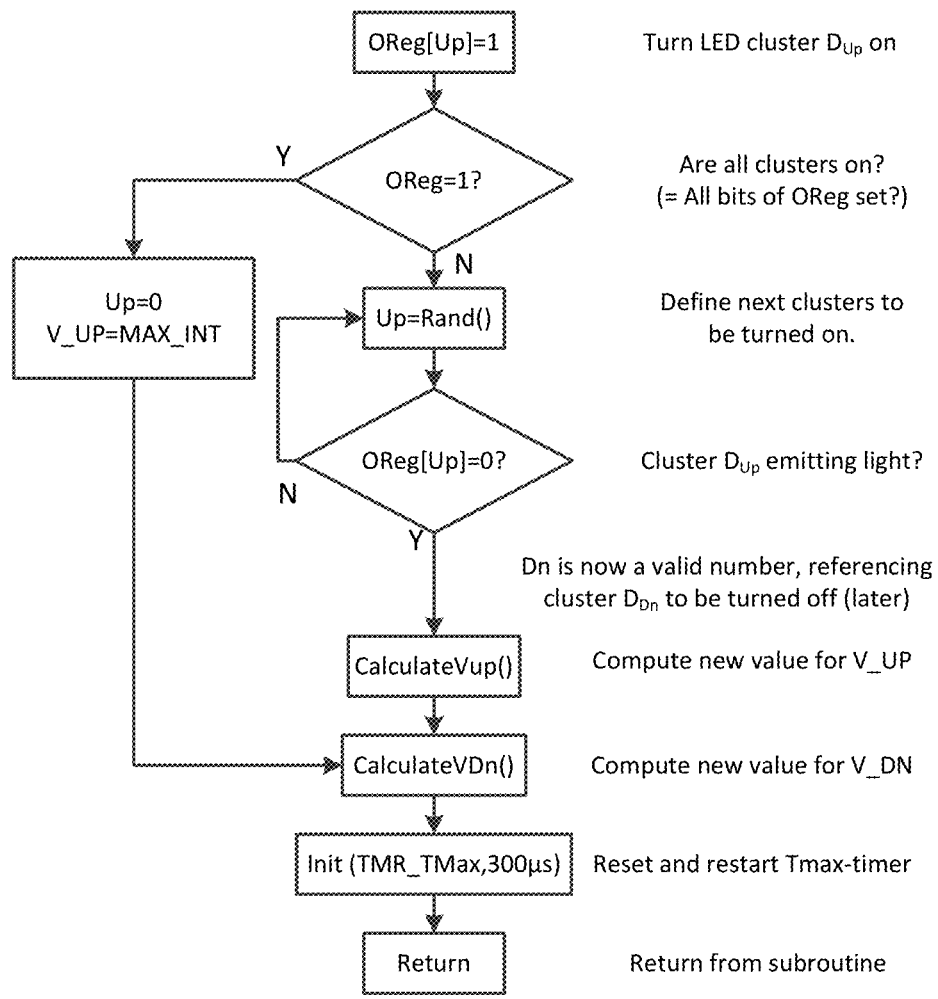

FIG. 8e illustrates the TurnLEDon( ) routine, configured in accordance with one embodiment of the present invention. As can be seen, the routine includes setting a register to turn LED cluster $D_{Up}$ on. A determination is then made as to whether all clusters are on (e.g., all bits of OReg set?). If yes, then reset variables Up and V_UP. If, on the other hand, all clusters are not on, then define the next clusters to be turned on. A determination is then made as to whether cluster $D_{Up}$ is emitting light. If not, then define the next cluster to be turned on. If, however, cluster $D_{Up}$ is emitting light, then Dn is now a valid number, referencing cluster $D_{Up}$ to be turned on (later), and continue with computing a new value for V_UP. The method continues with compute a new value for V_DN, as well as resetting and restarting the Tmax-timer. A subroutine return can then be processed back to main program.

Switching Schemes and Strategies

As previously explained, a microcontroller can be used to implement the control logic, in accordance with some embodiments. In some such cases, the microcontroller can be configured to actively match the line voltage of an AC power supply to the forward voltage drop of the LED strings, while controlling the number of active parallel strings keeps the power factor as close to unity as possible. Additionally, the switching scheme according to some such embodiments assures that all of the LEDs on average operate similar lengths of time and at the similar temperatures, thus, allowing them to more uniformly wear-out. As previously also explained, the LEDs in the string may be a single LED or an LED-block that includes some combination of serial and/or parallel connected LEDs.

Figure 9:
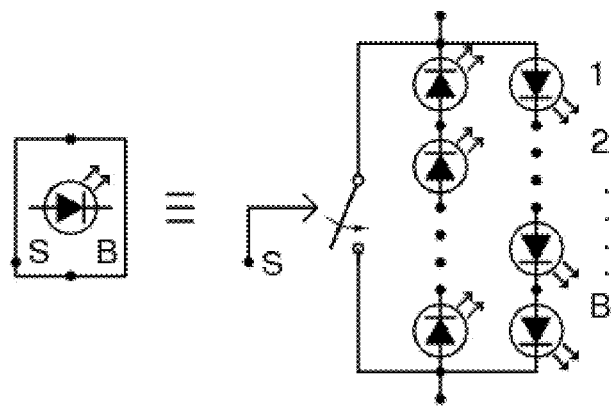
FIG. 9 schematically illustrates a single LED-block that can be used in accordance with one example embodiment of the present invention.

FIG. 9 schematically illustrates a single LED-block that can be used in accordance with one example embodiment of the present invention. As can be seen, the LED-block includes two anti-parallel strings of LEDs, each consisting of B diodes. The forward voltage drop of the LED-block is $V_{f,B}=B \cdot V_f$, where $V_f$ is the forward voltage drop of a single LED. The switch S is externally controlled, and when open, it allows the electric current to pass through one of the strings, depending on the polarity. Note that this LED-block can be implemented, for example, with discrete diode and switch components populated on a printed circuit board, or as an integrated circuit fabricated using typical semiconductor processes and material systems (e.g., metal oxide semiconductor (MOS) switches and epi-LEDs made with suitable column V and/or III-V materials such as indium aluminum gallium phosphide based LEDs and grown on or transferred to a suitable substrate such as a silicon, germanium, sapphire, gallium nitride and gallium arsenide substrate).

Figure 10:
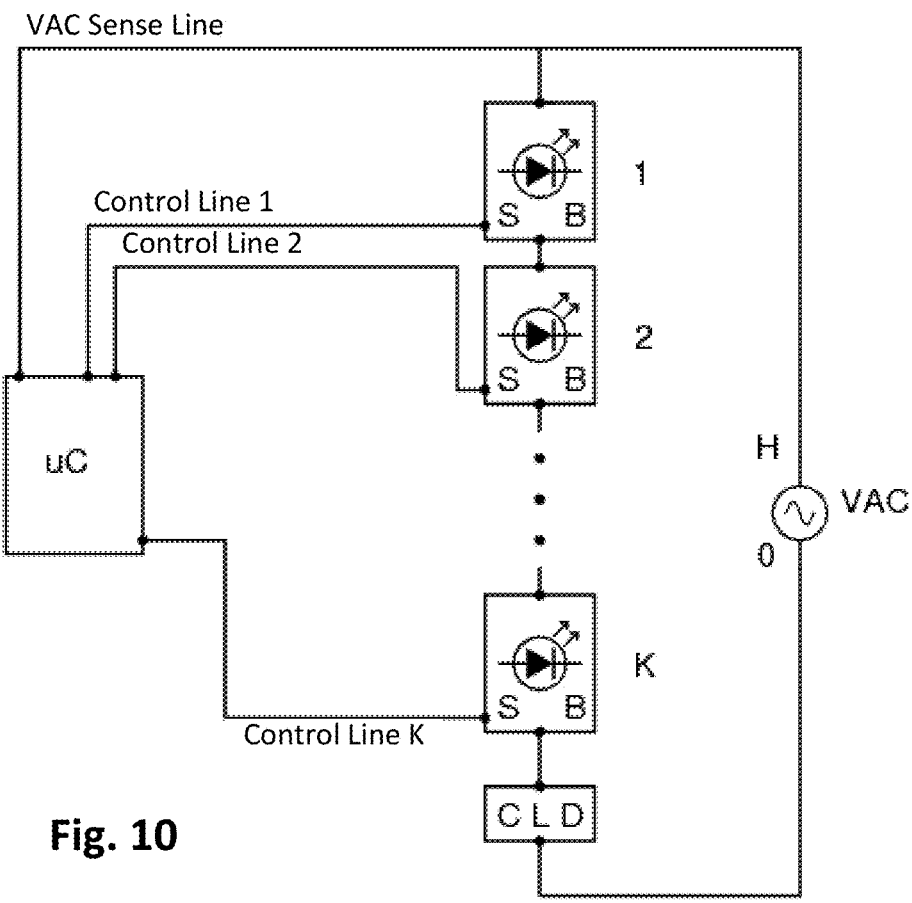
FIG. 10 schematically illustrates a single-string mode device wherein a number K of LED-blocks are connected in series together with the current limiting device (CLD), in accordance with one example embodiment of the present invention.

FIG. 10 schematically illustrates a single-string mode device wherein a number K of LED-blocks are connected in series together with the current limiting device (CLD), in accordance with one example embodiment of the present invention. The microcontroller μC is programmed or otherwise configured to switch the LED-blocks on and off, depending on the magnitude and direction of the line voltage and the switching strategy being utilized. In accordance with one specific such embodiment, this mode utilizes the microcontroller to do the switching of a series of the LED-blocks, where the total number of LED-blocks, K, matches the maximum amplitude of AC voltage, $V_{AC}$, wherein $V_{AC} \leq K \cdot (B \cdot V_f)$. Here, B is the number of LEDs in series that comprise a single LED-block, where one LED-block may include, for example, two such series connected in anti-parallel as shown in FIG. 9. The microcontroller activates or deactivates the LED-blocks.

An LED-block becomes active when its switch S is open, and, conversely, an LED-block becomes inactive when its switch S is closed. The microcontroller is configured to sense the line voltage and its direction (increasing, or dV/dt>0; or decreasing, dV/dt<0) and choose the switches that are going to be open (for case dV/dt>0) or closed (dV/dt<0) so that the line voltage slightly exceeds the forward voltage drop of the active LED-blocks (e.g., such that line voltage is no more than about 20% greater than $V_f$). The number of active LED-blocks can be chosen, for instance, by the requirement that the active LEDs at that particular moment to light-up with the forward current $I_f$. The purpose of the current limiting device (CLD) is to assure that the current through the LED-string does not deviate significantly from the same value $I_f$ (within an acceptable tolerance of $I_f$, such as within 10%, or 5%, or 3%, or 1%, depending on desired performance).

Figure 11A:
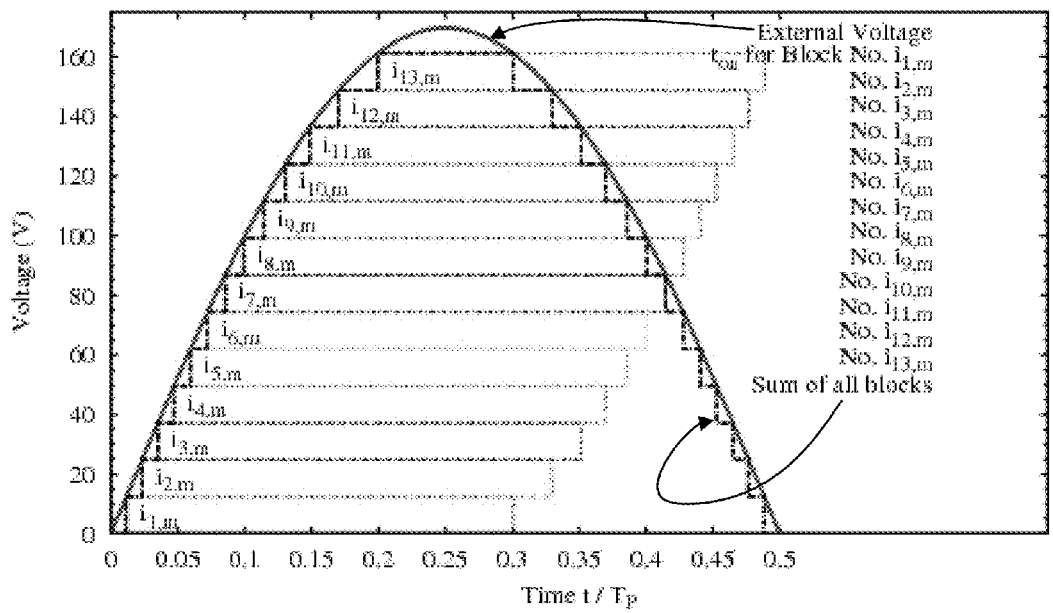
FIGS. 11a-b graphically illustrate a single-string mode wherein the microcontroller implements a first-on-first-off (FIFO) switching strategy, in accordance with an embodiment of the present invention.
Figure 11B:
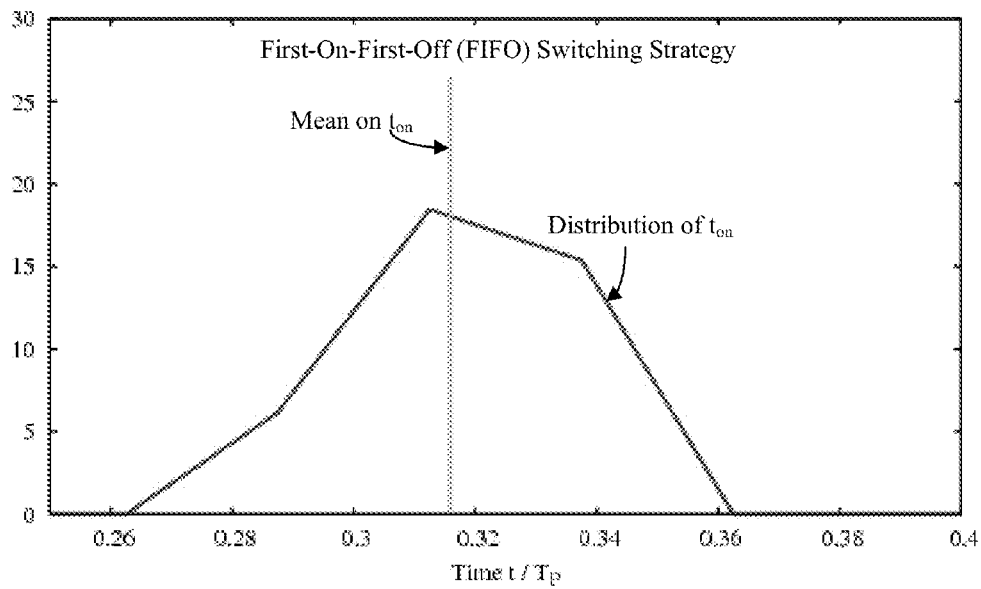

FIGS. 11a-b graphically illustrate a single-string mode wherein the microcontroller implements a first-on-first-off (FIFO) switching strategy (FIG. 11a). The FIFO strategy results in a fairly narrow distribution of on-times of each diode (FIG. 11b), which through additional cycling operation effectively makes the average on-time of all LEDs the same (or otherwise within an acceptable on-time range), which in turn causes all the LEDs to age under very similar operating conditions. The example shown here utilizes $V_{AC}=169.7$ V, B=4, and $V_f=3.1$ V. Other single-string mode switching schemes can be used, as will be appreciated in light of this disclosure.

For instance, in another single-string mode switching scheme, the microcontroller activates or deactivates one LED-block at the time. In another example single-string mode switching scheme, instead of activating the first LED-block, the first M LED-blocks are activated. The purpose of the second scheme is to decrease a load on the current limiting device CLD by decreasing the time the CLD is needed. In particular, the CLD is not needed until the line voltage reaches the value $M \cdot B \cdot V_f$, but thereafter it absorbs the voltage in range 0 to $B \cdot V_f$ before the next LED-block is activated.

In any such cases, the microcontroller can be programmed or otherwise configured to implement a switching strategy for given scheme. For purposes of further explanation and example switching schemes, let $T_P$ be the period of line voltage, and $f=1/T_P$ its frequency. In the scheme where the LED-blocks are activated or deactivated one at the time, there exists a sequence of time instances $t_k$, for k=1, K at which $V(t) = V_{AC} \cdot \sin(2 \cdot \pi \cdot f \cdot t)$, that achieves the values $k \cdot B \cdot V_f = VAC \cdot \sin(2 \cdot \pi \cdot f \cdot t_k)$, where $0 \le t_k \le T_P/4$. As will now be discussed, various example switching strategies can be used in accordance with some embodiments, including FOOL, FOOF, ROO, PFOOL, and PFOOF strategies.

First-on Off-Last (FOOL):

In this example switching scheme, within a single half-period, the $j^{th}$ LED-block is activated by the microcontroller at time $t_j < T_P/4$ and deactivated at time $\bar{t}_j = T_P/2 - t_j$. This strategy is relatively simple to implement and does not necessarily require a microprocessor. As will be appreciated, a duration of time the $j^{th}$ LED-block is active, given by $T_j = T_P/2 - 2t_j$, is fixed, and is shorter for the LED-blocks that are activated later. As will be further appreciated, note that some LED-blocks can be active for a different amount of time relative to other LED-blocks in the string. Thus, in this particular example scheme, further note that the LEDs do not necessarily age the same way, in that those LED-blocks that are active more age faster than those LED-blocks that are less active. If this is undesirable, then the next example switching strategy can be used to homogenize aging across all LED-blocks in a given string.

First-on Off-First (FOOF).

In this example switching scheme, as in the FOOL strategy, the $j^{th}$ LED-block is activated by the microcontroller at time $t_j < T_P/4$, but it is deactivated by the microcontroller at the time $\bar{t}_j = T_P/2 - t_{K-j+1}$, leading to $T_j = T_P/2 - t_j - t_{K-j+1}$, and shown in FIG. 11a. The distribution of $T_j$'s shown in FIG. 11b is fairly narrowly centered around the mean, $T_j = (0.31 +/- 0.05) T_P$.

Random-on-and-Off (ROO).

In this example switching scheme, the microcontroller is configured to randomly activate and deactivate each LED-block. In the best case it achieves the performance of the FOOF, while in the worst case the performance of the FOOL strategy. The random activity pattern may make it difficult to assess the thermal performance of the device, and additionally, may require the microcontroller to run a random number generator in accordance with some such embodiments, which may be considered a computationally expensive task.

In some such embodiments, there may be a processor present in the circuit (e.g., within the microcontroller, or a dedicated microprocessor) which can be utilized to better manage the LED-blocks, where their switching order is rotated. Such alternative embodiments are now considered in the contents of FOOL and FOOF strategies, to provide additional example embodiments.

Periodic First-on Off-Last (PFOOL).

In this example switching strategy, for given $V_{AC}$ and size of the LED-block B, the number of LED-blocks follows from $K \cdot B \cdot V_f \le V_{AC}$. The output of an AC source can be divided with respect to time into the segments of length $K \cdot T_P$, where one segment refers to one cycle, and where K cycles make one period. Then, the strategy comprises the following: in the first cycle the FOOL switching scheme is utilized for the LED-blocks $i_1^1 = 1$ through $i_K^1 = K$; in the second cycle the FOOL switching scheme is utilized again, but for the LED-blocks $i_1^2 = K, i_2^2 = 1, \ldots i_K^2 = K-1$. More generally, in the $m^{th}$ cycle, $1 \le m \le K$, the basic FOOL scheme can be utilized for the LED-blocks $i_j^m = (j+m-1)$ modulo K, meaning that the $j^{th}$ LED-block is activated at $t_{i_j^m}$, and deactivated at $\bar{t}_{i_j^m} = T_P/2 - t_{i_j^m}$. Compared to the base FOOL strategy previously discussed, here all LED-blocks go through the same sequence of switching, implying that all the LED-blocks over the duration of one period (K cycles) are active the same length of time, and thus uniformly utilized. Note, however, that during one period of the PFOOL strategy, the individual LED-blocks are subjected to varying lengths of active periods and their temperatures may vary accordingly. Thus, consideration may be given to whether such variation is acceptable.

Periodic First-on Off-First (PFOOF).

In this example switching strategy, for each of the cycles 1 through K cycles, the FOOF switching scheme is utilized, where the indices between the cycles are cyclically permuted. More generally, in the $m^{th}$ cycle, $1 \le m \le K$, the basic FOOF scheme is utilized for the LED-blocks $i_j^m = (j+m-1)$ modulo K, meaning that the $j^{th}$ LED-block is activated at $t_{i_j^m}$, and deactivated at $\bar{t}_{i_j^m} = T_P/2 \cdot t_{K-i_j^m+1}$. In this example embodiment, the FOOF scheme can be used to assure that within a single cycle there will be little variation between the active times of the LED-blocks (e.g., all on-times within 10% or less of each other, such as within 5%, or 2%, or 1%), while the additional cycling through the order at which the LED-blocks are activated and deactivated assures that all the LED-blocks will be active on average about the same duration of time with minimal variations through the cycles of one period.

As will be appreciated in light of this disclosure, a problem associated with a single-string application of the zero-energy storage configuration is that during the operation the voltage across the device varies sinusoidally, while the current is approximately fixed at $I_f$, which is the desired forward current at which the LEDs are intended to operate. As such, the power factor associated with such a circuit may be unacceptable for some applications. One way of improving the power factor is to use a multi-string application of the zero-energy storage configuration.

Figure 12:
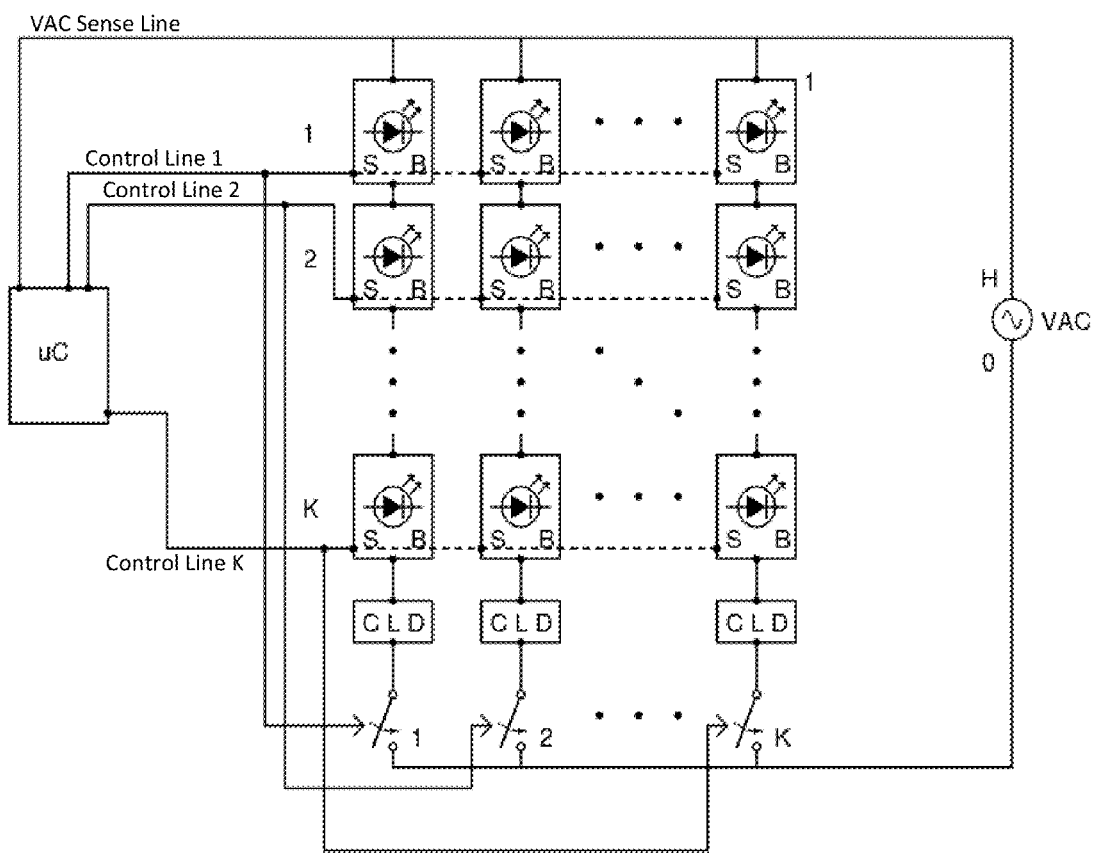
FIG. 12 schematically illustrates a multi-string mode application of a ZES configuration, in accordance with an embodiment of the present invention.

FIG. 12 schematically illustrates a multi-string mode application of a ZES configuration, in accordance with an embodiment of the present invention. As can be seen, there are a number K of LED strings (blocks in series with CLD) connected in parallel. The microcontroller (μC) is programmed or otherwise configured to simultaneously activate the LED-blocks and the strings (using the same control line). The order of activation depends on the magnitude and direction of the line voltage and the switching strategy being utilized, as previously described.

In the multi-string mode of application, the microcontroller can be configured to control a matrix of K-by-K LED-blocks. The total number of switches is equal to the number of blocks (K·K) plus the numbers of strings (K), which equals $K+K^2$. In one embodiment shown in FIG. 12, the switches are controlled with only K control lines (even though there are $K+K^2$ switches) from the microcontroller. The $j^{th}$ control line controls the $j^{th}$ string, and the $j^{th}$ LED-block in each of the K strings. As will be appreciated in light of this disclosure, the multi-string mode of application can be used to improve the power factor of a device. With increasing voltage, not only the new block in the string is activated, but also the additional string. So if k is the number of active blocks, then this also represents the number of active strings. The result is that the current (equal to $k \cdot I_f$) and the voltage (equal to $k \cdot (B \cdot V_f)$) on the device are always proportional, with the same proportionality factor.

Because of a relatively small number of control lines, the active times of blocks in a string vary the same way as in the single-string FOOL strategy. For example, the last block of the first string is deactivated when either the last string or the first string are deactivated. For that reason, periodicity can be added to the switching order as was previously explained with respect to PFOOF and in PFOOL strategies. Again, the period of the device can be set to K·$T_P$, where one $T_P$ time interval refers to one cycle. Then, in each cycle a FOOL or FOOF strategy is performed on blocks/strings, where the blocks are chosen cyclically, as previously discussed. The result is that, while over a cycle the operating conditions between the blocks vary considerably, these even out over one period. In this way, note that not only is good power factor of the device obtained, but also that all the LEDs of the device evenly wear-out.

Figure 13:
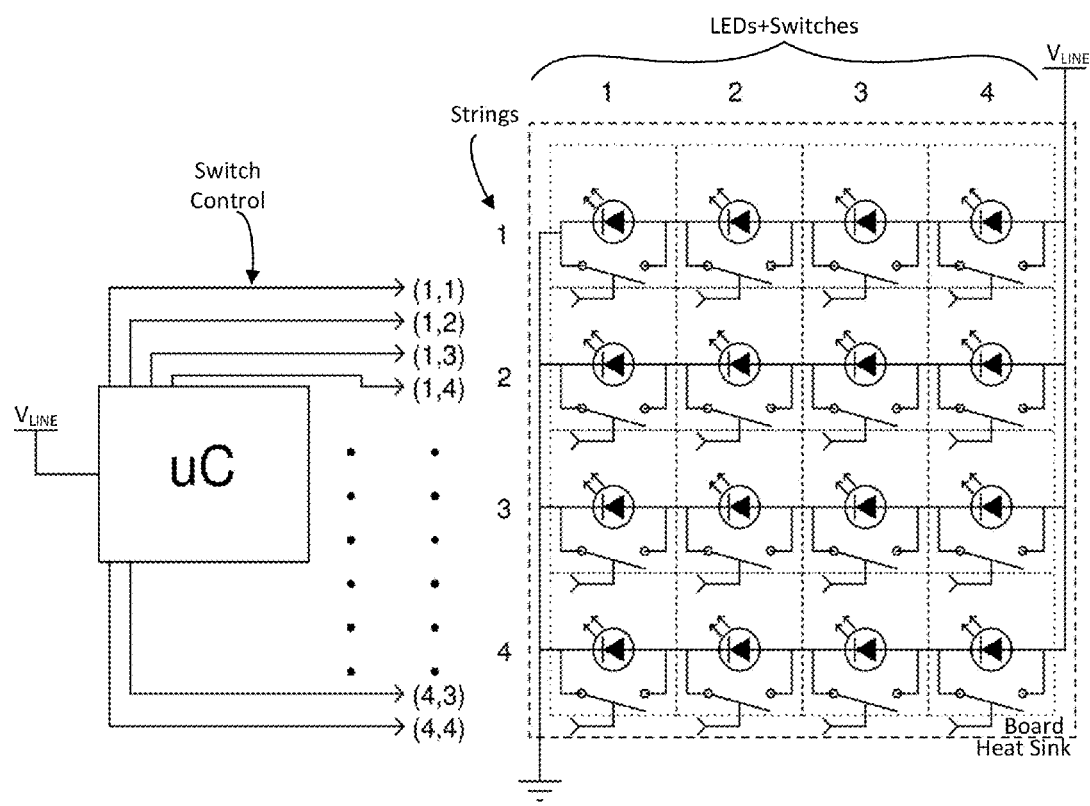
FIG. 13 schematically illustrates a specific example lighting device configured in accordance with an example embodiment of the present invention.

FIG. 13 schematically illustrates a specific example lighting device configured in accordance with an example embodiment of the present invention. This example embodiment is using 4×4=16 block with a maximum number of 16 control lines. As can be seen, the device includes four LED strings, each containing four LEDs or clusters of LEDs, and a microcontroller (µC) configured to determine which of the LEDs in each string are switched on in response to the rectified AC voltage $V_{LINE}$. For sake of a simplified illustration, the four current limiting devices in each of the four strings are not shown. The LEDs and switches are populated on a board (e.g., printed circuit board or other suitable substrate/carrier) configured with a common heat sink. $V_{LINE}$ varies, and the microcontroller determines how many LEDs in each string may be active at any time while the rest are shorted. For purposes of discussion, let the utilization of a string be s/S, wherein S is the total number of strings and s is the number of active strings within a time segment. The time period $t_p$ ($t_p$ is half of the line period) is divided into k·S time segments of equal length. During each segment the line voltage can be approximated as being constant.

As an example of switching taking place during one time segment (as previously discussed) or of switching taking place in case of supplying the circuit with DC voltage, assume the following constraints: S=4 and s=2, with k=1 so that the number of sub-periods is S, as well. It should be understood that those sub-periods are part of one time segment. The switching strategies employed include: (1) periodic, where each LED has fixed duty cycle s/S, and the times when any LED is active is periodic (variant of FOOL strategy); (2) shuffled, where each LED has fixed duty cycle s/S, but the times when any LED is active are randomly chosen, wherein the rows and the columns of the matrix in Table 6 are shuffled at the beginning of each period (variant of ROO strategy); and (3) random, where LEDs do not have fixed duty cycle, and the only constraint is that at any time s of S LEDs are active (variant of ROO strategy). As previously explained, recall that strategies 2 and 3 may employ a processor to generate random numbers.

TABLE 6

Periodic Active LED Time

| LED | $\Delta t_1$ | $\Delta t_2$ | $\Delta t_3$ | $\Delta t_4$ |
|---|---|---|---|---|
| LED1 | 1 | 1 | | |
| LED2 | | 1 | 1 | |
| LED3 | | | 1 | 1 |
| LED4 | 1 | | | 1 |

For each of these example switching scenarios, temperatures in the 4×4 LED array of the example device in FIG. 13 were measured, wherein each LED is driven using: (1) a periodic strategy with s/S=2/4; (2) a shuffling strategy with s/S=2/4; or (3) a random strategy with s/S=2/4. Test results indicate that driving LEDs under periodic conditions produced the smallest LED junction temperature variation, in accordance with an embodiment of the present invention and earlier discussion.

Driver Configurations with Energy Storage

Figure 14:
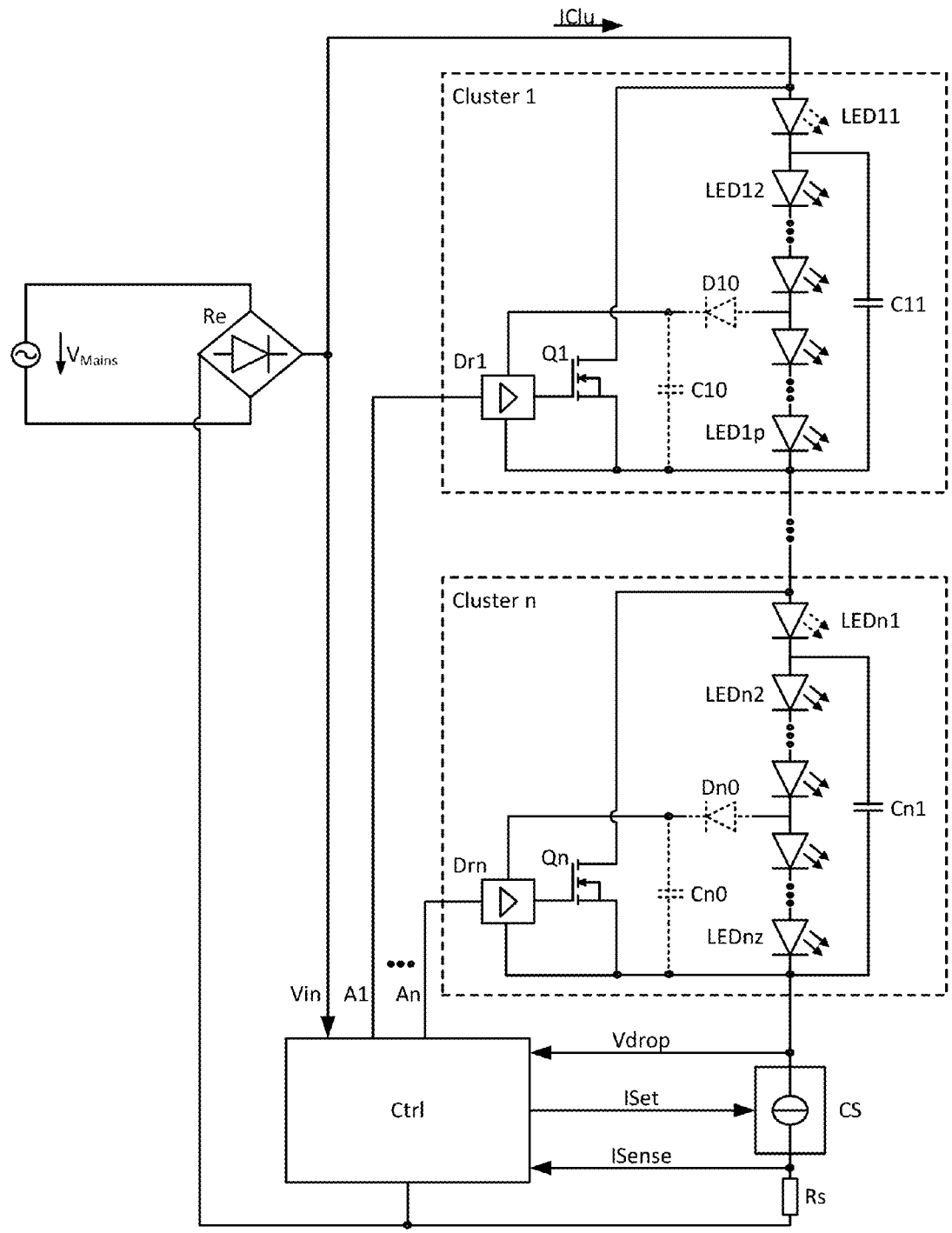
FIG. 14 schematically illustrates a lighting device which incorporates a light engine configured in accordance with another embodiment of the present invention.

As will be appreciated in light of this disclosure, while some embodiments provided herein can be configured to power LEDs directly driven from the mains with no significant energy storage within the driver, other embodiments may include energy storage. FIG. 14 schematically illustrates one such embodiment, which includes a lighting device which incorporates a light engine configured to allow powering a long series string of LEDs off the mains without using a sophisticated and hence costly switch-mode power supply, but does include energy storage elements (capacitors C11 through Cn). A light engine can be, for example, a printed circuit board populated with electronic components including all the LEDs which are used together with additional optical and mechanical parts to a provide complete luminaire.

As can be seen, the long series string of LEDs is made up of n clusters (Cluster 1 through Cluster n). Each cluster may be comprised of several LEDs. The number of LEDs in each cluster may vary from cluster to cluster. This string of LEDs is in series with a current source CS and a shunt resistor Rs, and is connected to the mains (e.g., 120 VAC @60 Hz, or some other suitable external source) through the bridge rectifier Re. The length of the LED string can be varied by opening and closing the switches Q1 . . . Qn (e.g., MOSFETs, or other suitable switch technology). This switching action is directed by the controller Ctrl (e.g., which may include the control logic as variously described herein, such as in the form of embedded firmware and/or gate-level logic). For purposes of discussion, assume there is current flowing through the LEDs of cluster 1. This means the capacitor C11 is charged up to the forward voltage drop of the LEDs LED12 through LED1p. Further assume the controller Ctrl toggles the signal A1 that goes to the (MOSFET high-side) driver Drv1 with then turns Q1 on. The current IClu is now flowing through Q1. As the capacitor C11 is charged, the diode LED11 is blocking and the capacitor gets discharged through the LEDs LED12 through LED1p. This means that LEDs LED12 through LED1p are still emitting light while the main current (IClu) is by-passed through Q1. Note that as the capacitor C11 is discharged over time, the luminous flux from the connected LEDs decreases. Nevertheless the demonstrated technique has the advantage of reducing the current ripple on LEDs (and hence light ripple) compared with zero energy storage (ZES) configurations. The reduction in LED ripple current increases the efficacy of the LEDs (as there is less efficacy loss due to droop).

Further note that the circuit design engineer has the freedom to freely choose the amount of energy stored in capacitors C11 . . . Cn1 by choosing their respective capacity. As will be appreciated in light of this disclosure, not all the capacitors need to have the same capacity—some clusters may have large capacitors (LEDs are well-buffered) where as other clusters may not even have a capacitor at all. The light modulation can be tailored to applications needs. Ceramic or electrolytic caps can be used for C11 . . . Cn1, in some such embodiments. LED chip utilization can be weighted against cost and reliability of capacitors. In contrast to LED12 through LED1p, the LED LED11 is not emitting light while Q1 is closed—it only emits light while IClu is flowing thought the LEDs of cluster 1. LEDs typically exhibit poor switching performance and in addition the utilization of LED11 to generate light may be low, so for various reasons it may make sense to use a conventional (e.g., silicon rectifier) diode instead of an LED for LED11. This is generally indicated by dashed arrows in the schematic symbol of LED11, ..., LEDn1.

As can be further seen, the high-side drivers Dr1 ... Drn that drive the switches Q1 ... Qn are powered from the LED string, in accordance with one example embodiment. Other embodiments may allocate another voltage supply to power the drivers Dr1 ... Drn. As will be appreciated in light of this disclosure, the diodes D10 ... Dn0 and capacitors C10 ... Dn0 can be employed in a ZES configuration, as there are no storage capacitors associated with each LED string. However, in a configuration such as shown in FIG. 14, given sufficiently large storage capacitors C11 through Cn1, the optional diodes D10 ... Dn0 and capacitors C10 ... Dn0 may be excluded (therefore those components are shown dotted). Further note that capacitors C10 ... Cn0 and diodes D10 ... Dn0 may still be beneficial in some such cases, depending on voltage ripple on capacitors C11 ... Cn1.

The current source CS can be implemented, for example, as a programmable current regulator, which limits the current through the LEDs to a maximum value. As further shown in the example embodiment of FIG. 14, this maximum value is set by the controller Ctrl through the control line ISet. The controller Ctrl may be implemented as a microcontroller, in some embodiments. In this particular example embodiment, the controller Ctrl is aware of the instantaneous line voltage by the input Vin as well as the string current (by measuring the voltage drop across the shunt resistor Rs) and the voltage drop across the current source CS (by sensing the voltage Vdrop and subtracting the voltage drop across the shunt resistor Rs). The voltage drop across the current source CS can be kept low by the control (through turning off switches/MOSFETs Q1 ... Qn) to provide high efficiency as the current source CS is basically a linear regulator.

The by-passing of LED clusters depending on the instantaneous line voltage (through activation and deactivation of switches Q1 ... Qn) not only allows the minimization of power loss in the current source CS but also allows a high power factor which may be required for some mains powered lighting applications. As will be further appreciated, any number of ZES and non-ZES configurations can be implemented with color-tunability by using different color LEDs in different clusters (sub-strings), in accordance with some embodiments. For instance, one such embodiment includes tunable white LEDs, wherein some of them are warm white LEDs and others are cold white LEDs. The various clusters may have different numbers of warm and/or cold white LEDs. In one specific embodiment, one cluster can be configured with half of the LEDs warm and the other half cold white LEDs, and all the other clusters have either more warm white LEDs (or only more warm white LEDs) or more cold white LEDs (or only cold white LEDs). Depending on the desired color temperature (requested by an overall lighting control system and/or based on user preference) some clusters may be preferred over other clusters (more frequently turned on, or less frequently). Numerous such variations will be apparent in light of this disclosure.

As will be further appreciated, changing the switching pattern need not be limited to being dependent on input voltage (instantaneous line voltage). For instance, in some embodiments, changing the switching pattern may depend on time (e.g., a timer inside the microcontroller can be used to signal a change in the switching pattern even though there was no change in input voltage). Such an embodiment can be used, for example, to provide uniform appearance in brightness (even if the circuit is powered with DC) and eliminates or otherwise reduces the potential of low frequency flicker.

In one such embodiment, the timer-based change to the switching pattern (e.g., a change in a rotational manner, which doesn't change the number of clusters turned on) can be made independently and regardless of possible additional changes to the switching pattern based on a change in input voltage. To provide flicker-free performance (i.e., flicker not perceptible by user), the pattern can repeat itself, for example, with $f_{flicker}$=125 Hz (or greater), which would ensure no perceptible flickering even with DC input voltage, in accordance with some embodiments.

In one example case, assume a very low DC input voltage so that only one LED cluster is on at any instant in time. With eight clusters (n=8) in a given light engine, the microcontroller can be programmed or otherwise configured to shift the switching bit pattern every $T_{shift}=1/(n*f_{flicker})=1$ ms. This is a relatively low switching frequency and switching losses (which increase approximately linear with the switching frequency of the switches Q1 ... Qn, in this example embodiment) will still be relatively small and hence will not significantly depreciate the overall efficiency of the circuit.

A number of benefits and advantages can thus be realized by such embodiments as shown in FIG. 14. For instance, clusters can by-passed by switches Q1 ... Qn which in turn minimizes power loss in the (linear) current regulator and further allows for high power factor. The number of active clusters may depends on instantaneous line voltage and/or a timer function. Clusters may have different colors. In any such cases, LEDs appear uniformly bright and may have low temperature ripple as a random/sequential switching scheme is utilized. Bypassing of clusters initiated by the controller (may use internal comparators) with switching frequencies in the order of 100 Hz to a few kHz, in accordance with some embodiments. In addition, thermal averaging can be used to increases light output and life. In addition, ach LED cluster may optionally include energy storage for improved chip utilization and low light modulation, which further includes a degree of design freedom with respect to the amount of energy stored. In addition, the lead LED in a given string may be regular pn-diode, Schottky-diode or LED. The light modulation can be tailored to applications needs, and high flexibility is provided due to programmability of factors such as input current which makes dimmability, high power factor, low total harmonic distortion (THD), phase-cut dimmer compatibility, color-tunability and high efficiency possible.

Numerous variations and configurations will be apparent in light of this disclosure. For example, one example embodiment of the present invention provides a lighting system. The system includes a plurality of light emitting diodes (LEDs) serially connected in a string, and a plurality of switches, each switch connected across a different set of the LEDs in the string. The system further includes a controller configured to selectively activate the switches in effort to provide a brightness that appears uniform to a human. In some cases, the controller selectively activates the switches so that the LED string has a forward voltage drop that is within 5% or less of a line voltage powering the system. In some cases, the controller selectively activates the switches so that the LED string has a forward voltage drop that is within 2% or less of a line voltage powering the system. In some cases, the controller is configured to selectively activate the switches using a random switching pattern. In some cases, the controller is configured to selectively activate the switches using a periodic switching pattern. In some cases, the controller is configured to measure forward voltage drop across the LED string, and switching decisions by the controller are based at least in part on the forward voltage drop. In some cases, each of the switches is associated with one or more of the LEDs to provide a switchable LED cluster, and the controller is configured to turn on as many clusters as possible so as to reduce losses in a current source in series with the LED string. In some cases, at any one moment in time, brightness of the brightest activated LED in the string is within 10% or less of brightness of dimmest activated LED in the string. In some cases, the system further includes a rectifier circuit configured to receive a voltage source and to provide a rectified voltage across the LED. In some cases, the system further includes a current source in series with the LEDs. In some cases, the LEDs can be powered directly from an AC or DC power source such that no switch-mode power supply output storage element is needed. In some cases, the system further includes one or more storage elements, each coupled in parallel with a corresponding cluster of a different one or more of the LEDs. In some cases, forward voltage drop across the LEDs is used to generate an auxiliary voltage that powers at least one of the switches and/or controller. In some cases, the system further includes a linear regulator configured to receive a line voltage, wherein the linear regulator is operated intermittently based on the received line voltage and is used to generate an auxiliary voltage that powers at least one of the switches and/or controller. Another example embodiment of the present invention provides an integrated circuit comprising the system as variously defined in this paragraph.

Another example embodiment of the present invention provides a lighting system. The system includes a plurality of light emitting diodes (LEDs) serially connected in a string, and a plurality of switches, each switch connected across a different set of the LEDs in the string. The system further includes a microcontroller configured to selectively activate the switches in effort to provide a brightness that appears uniform to a human, and wherein the microcontroller selectively activates the switches so that the LED string has a forward voltage drop that is within 20% or less of a line voltage powering the system. In some cases, the controller is configured to selectively activate the switches using at least one of a random switching pattern and/or a periodic switching pattern. In some cases, the controller is configured to measure forward voltage drop across the LED string, and switching decisions by the controller are based at least in part on the forward voltage drop.

Another example embodiment of the present invention provides a lighting system. The system includes a plurality of light emitting diodes (LEDs) serially connected in a string, and a plurality of switches, each switch connected across a different set of the LEDs in the string. The system further includes a linear regulator in series with the LEDs, and a microcontroller configured to selectively activate the switches in effort to provide a brightness that appears uniform to a human, wherein each of the switches is associated with one or more of the LEDs to provide a switchable LED cluster, and the controller is further configured to turn on as many clusters as possible so as to reduce losses in the linear regulator. In some cases, the controller is configured to selectively activate the switches using at least one of a random switching pattern and/or a periodic switching pattern. In some cases, the system further includes one or more storage elements, each coupled in parallel with a corresponding cluster of a different one or more of the LEDs.

Another example embodiment of the present invention provides a lighting system. The system includes a plurality of light emitting diodes (LEDs) serially connected in a string, and a plurality of switches, each switch connected across a different set of the LEDs in the string. The system further includes a controller configured to selectively activate the switches, wherein forward voltage drop across the LEDs is used to generate an auxiliary voltage that powers at least one of the switches and/or controller.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A lighting system, comprising:
   a plurality of light emitting diodes (LEDs) serially connected in a string;
   a plurality of switches, each switch connected across a different set of the LEDs in the string; and
   a controller configured to selectively activate the switches in effort to provide a brightness that appears uniform to a human wherein forward voltage drop across the LEDs is used to generate an auxiliary voltage that powers at least one of the switches and/or controller.

2. The system of claim 1 wherein the controller selectively activates the switches so that the LED string has a forward voltage drop that is within 5% or less of a line voltage powering the system.

3. The system of claim 1 wherein the controller selectively activates the switches so that the LED string has a forward voltage drop that is within 2% or less of a line voltage powering the system.

4. The system of claim 1 wherein the controller is configured to selectively activate the switches using a random switching pattern.

5. The system of claim 1 wherein the controller is configured to selectively activate the switches using a periodic switching pattern.

6. The system of claim 1 wherein the controller is configured to measure forward voltage drop across the LED string, and switching decisions by the controller are based at least in part on the forward voltage drop.

7. The system of claim 1 wherein each of the switches is associated with one or more of the LEDs to provide a switchable LED cluster, and the controller is configured to turn on as many clusters as possible so as to reduce losses in a current source in series with the LED string.

8. The system of claim 1 wherein at any one moment in time, brightness of the brightest activated LED in the string is within 10% or less of brightness of dimmest activated LED in the string.

9. The system of claim 1 further comprising a rectifier circuit configured to receive a voltage source and to provide a rectified voltage across the LED.

10. The system of claim 1 further comprising a current source in series with the LEDs.

11. The system of claim 1 wherein the LEDs can be powered directly from an AC or DC power source such that no switch-mode power supply output storage element is needed.

12. The system of claim 1 further comprising one or more storage elements, each coupled in parallel with a corresponding cluster of a different one or more of the LEDs.

13. The system of claim 1 further comprising a linear regulator configured to receive a line voltage, wherein the linear regulator is operated intermittently based on the received line voltage and is used to generate an auxiliary voltage that powers at least one of the switches and/or controller.

14. An integrated circuit comprising the system of claim 1.

15. A light engine comprising the system of claim 1.

16. A lighting system, comprising:
a plurality of light emitting diodes (LEDs) serially connected in a string;
a plurality of switches, each switch connected across a different set of the LEDs in the string;
a microcontroller configured to selectively activate the switches in effort to provide a brightness that appears uniform to a human, and wherein the microcontroller selectively activates the switches so that the LED string has a forward voltage drop that is within 20% or less of a line voltage powering the system; and
a linear regulator configured to receive a line voltage, wherein the linear regulator is operated intermittently based on the received line voltage and is used to generate an auxiliary voltage that powers at least one of the switches and/or microcontroller.

17. The system of claim 16 wherein the controller is configured to selectively activate the switches using at least one of a random switching pattern and/or a periodic switching pattern.

18. The system of claim 16 wherein the controller is configured to measure forward voltage drop across the LED string, and switching decisions by the controller are based at least in part on the forward voltage drop.

19. A lighting system, comprising:
a plurality of light emitting diodes (LEDs) serially connected in a string;
a plurality of switches, each switch connected across a different set of the LEDs in the string;
a linear regulator in series with the LEDs;
a microcontroller configured to selectively activate the switches in effort to provide a brightness that appears uniform to a human, wherein each of the switches is associated with one or more of the LEDs to provide a switchable LED cluster, and the controller is further configured to turn on as many clusters as possible so as to reduce losses in the linear regulator; and
a linear regulator configured to receive a line voltage, wherein the linear regulator is operated intermittently based on the received line voltage and is used to generate an auxiliary voltage that powers at least one of the switches and/or microcontroller.

* * * * *